(12) United States Patent
Seal

(10) Patent No.: US 12,550,406 B2
(45) Date of Patent: Feb. 10, 2026

(54) PACKAGED ELECTRONIC DEVICES HAVING TRANSIENT LIQUID PHASE SOLDER JOINTS AND METHODS OF FORMING SAME

(71) Applicant: Wolfspeed, Inc., Durham, NC (US)

(72) Inventor: Sayan Seal, Fayetteville, AR (US)

(73) Assignee: Wolfspeed, Inc., Durham, NC (US)

( * ) Notice: Subject to any disclaimer, the term of this patent is extended or adjusted under 35 U.S.C. 154(b) by 594 days.

(21) Appl. No.: 17/707,084

(22) Filed: Mar. 29, 2022

(65) Prior Publication Data
US 2023/0317670 A1 Oct. 5, 2023

(51) Int. Cl.
| | | |
|---|---|---|
| H01L 23/498 | (2006.01) | |
| H01L 23/00 | (2006.01) | |
| H10D 64/01 | (2025.01) | |
| H10D 64/23 | (2025.01) | |
| H10D 64/27 | (2025.01) | |
| H10D 64/62 | (2025.01) | |
| H10D 64/66 | (2025.01) | |

(52) U.S. Cl.
CPC ........ *H01L 24/32* (2013.01); *H01L 23/49822* (2013.01); *H01L 23/49866* (2013.01); *H01L 24/48* (2013.01); *H01L 24/83* (2013.01); *H10D 64/01* (2025.01); *H10D 64/252* (2025.01); *H10D 64/258* (2025.01); *H10D 64/518* (2025.01); *H10D 64/62* (2025.01); *H10D 64/666* (2025.01); *H01L 2224/32225* (2013.01); *H01L 2224/32245* (2013.01); *H01L 2224/48175* (2013.01); *H01L 2224/83203* (2013.01); *H01L 2224/8384* (2013.01); *H01L 2924/13055* (2013.01); *H01L 2924/13091* (2013.01); *H01L 2924/182* (2013.01)

(58) Field of Classification Search
None
See application file for complete search history.

(56) References Cited

U.S. PATENT DOCUMENTS

| | | | | |
|---|---|---|---|---|
| 2008/0054425 | A1* | 3/2008 | Malhan | H01L 24/01 |
| | | | | 257/E25.016 |
| 2011/0220704 | A1* | 9/2011 | Liu | H01L 24/83 |
| | | | | 428/646 |
| 2012/0306105 | A1* | 12/2012 | Robert | H01L 24/83 |
| | | | | 438/119 |
| 2013/0001782 | A1* | 1/2013 | Otsuka | B23K 35/0238 |
| | | | | 257/773 |
| 2014/0159054 | A1* | 6/2014 | Otake | H01L 23/16 |
| | | | | 257/77 |
| 2015/0008253 | A1* | 1/2015 | Yoon | H01L 24/83 |
| | | | | 228/179.1 |

(Continued)

*Primary Examiner* — Cory W Eskridge
(74) *Attorney, Agent, or Firm* — Myers Bigel, P.A.

(57) ABSTRACT

A packaged electronic device comprises a power semiconductor die that includes a first terminal and a second terminal, a power substrate comprising a dielectric substrate having a first metal cladding layer on an upper surface thereof, an encapsulation covering the power semiconductor die and at least a portion of the power substrate, a first lead extending through the encapsulation that is electrically connected to the first terminal, and a second lead extending through the encapsulation that is electrically connected to the second terminal. The first terminal is bonded to the first lead via a first transient liquid phase solder joint.

27 Claims, 12 Drawing Sheets

(56) References Cited

U.S. PATENT DOCUMENTS

| | | | |
|---|---|---|---|
| 2016/0129530 A1* | 5/2016 | Greve | B23K 35/262 |
| | | | 75/228 |
| 2017/0207160 A1* | 7/2017 | Gowda | H01L 25/16 |
| 2018/0068934 A1* | 3/2018 | Cho | H01L 23/49575 |
| 2018/0207160 A1* | 7/2018 | Schroeder | A61K 31/522 |
| 2020/0075529 A1* | 3/2020 | Otsuka | H01L 23/49844 |
| 2022/0181310 A1* | 6/2022 | Wu | H01L 25/105 |
| 2022/0359336 A1* | 11/2022 | Kobayashi | H01L 25/072 |

\* cited by examiner

PACKAGED ELECTRONIC DEVICES HAVING TRANSIENT LIQUID PHASE SOLDER JOINTS AND METHODS OF FORMING SAME

FIELD OF THE INVENTION

The present invention relates to semiconductor devices and, more particularly, to packaged electronic devices.

BACKGROUND

Power semiconductor devices refer to devices that include one or more "power" semiconductor die that are designed to carry large currents (e.g., tens or hundreds of Amps) and/or that are capable of blocking high voltages (e.g., hundreds, thousand or tens of thousands of volts). A wide variety of power semiconductor die are known in the art, including Metal Oxide Semiconductor Field Effect Transistors ("MOSFETs"), insulated gate bipolar junction transistors ("IGBTs"), Schottky diodes, and the like. Power semiconductor die are often fabricated from wide band-gap semiconductor materials, such as silicon carbide ("SiC") or gallium nitride ("GaN") based semiconductor materials.

Power MOSFETs are one widely used packaged semiconductor device. A power MOSFET is a three terminal device that has gate, drain and source terminals and a semiconductor layer structure that is often referred to as a semiconductor body. A source region and a drain region that are separated by a channel region are formed in the semiconductor body, and a gate electrode (which may act as the gate terminal or be electrically connected to the gate terminal) is disposed adjacent the channel region. The MOSFET may be turned on (to conduct current through the channel region between the source and drain regions) by applying a bias voltage to the gate electrode, and may be turned off (to block current flow through the channel region) by removing the bias voltage (or reducing the bias voltage below a threshold level).

One or more power semiconductor die are typically mounted within a protective package to provide packaged semiconductor devices. So-called "discrete" packaged semiconductor devices refer to a single power semiconductor die that is incorporated within a protective package. Examples of such discrete packaged semiconductor devices are packaged MOSFETs, Schottky diodes, IGBTs and the like. Packaged power semiconductor modules refer to modules that include multiple power semiconductor dies in a single package (which are typically electrically connected to each other, either directly or through additional circuit elements) or a single power semiconductor die and additional circuitry that are mounted in a common package.

FIG. 1 is a schematic cross-sectional view of a conventional, state-of-the-art, packaged electronic device 1. As shown in FIG. 1, the packaged electronic device 1 includes a power semiconductor die 10 that is mounted on a power substrate 50. An overmold encapsulation 60 covers the power semiconductor die 10 and at least a portion of the power substrate 50. The power semiconductor die 10 includes a plurality of terminals. For example, a power MOSFET may include a gate terminal 20, a source terminal 22 and a drain terminal 24. It will be appreciated that if the conductivity type of the power MOSFET is reversed, the drain terminal will be on the same side of the device as the gate terminal and the source terminal will be on the opposite side of the device. Accordingly, herein the source and drain terminals may be generically referred to as "source/drain" terminals since the locations of the source and drain terminals change based on the conductivity type of the device. The gate and source terminals 20, 22 are located on the upper side of the power semiconductor die 10 and the drain terminal 24 is located on the lower side of the power semiconductor die 10. Each terminal 20, 22, 24 is implemented as an exposed metal pad that includes a base metal 26 that has a metal plating 28 on an outer surface of the base metal 26. The metal plating 28 comprises gold, and may be a multilayer plating (e.g., a nickel-palladium-gold plating or a nickel-gold plating) with the gold layer being the outer layer (i.e., the layer further away from the semiconductor die 10).

The power substrate 50 comprises a dielectric substrate 52 and first and second copper cladding layers 56-1, 56-2. The first copper cladding layer 56-1 is formed on a first (upper) surface of the dielectric substrate 52, and the second copper cladding layer 56-2 is formed on a second (lower) surface of the dielectric substrate 52. The drain terminal 24 of power semiconductor die 10 is bonded using a sintering process to the first copper cladding layer 56-1 using a die attach material 44 such as a silver based material to physically and electrically connect the drain terminal 24 (and hence the power semiconductor die 10) to the first copper cladding layer 56-1. A gate lead 30 is electrically connected to the gate terminal 20 via a bond wire 40, and a source lead 32 is physically bonded and electrically connected to the source terminal 22 via a solder/sinter bond 42. A drain lead 34 is electrically connected to the first copper cladding layer 56-1 via a solder/sinter bond 46. The drain lead 34 is electrically connected to the drain terminal 24 through the solder/sinter bond 46, the first copper cladding layer 56-1 and the die attach material 44. Each of the gate lead 30, the source lead 32 and the drain lead 34 extend outside the overmold encapsulation 60 and are held in place by the overmold encapsulation 60.

SUMMARY

Pursuant to embodiments of the present invention, packaged electronic devices are provided that include a power semiconductor die that comprises a first terminal and a second terminal; a power substrate comprising a dielectric substrate having a first metal cladding layer on a first surface of the dielectric substrate; and a package that includes a first lead that is electrically connected to the first terminal and configured to connect to a first external circuit and a second lead that is electrically connected to the second terminal and configured to connect to a second external circuit. The first terminal is bonded to the first lead via a first transient liquid phase solder joint. In some embodiments, the second terminal may be bonded to the second lead via a second transient liquid phase solder joint. In other embodiments, the second lead may be electrically connected to the second terminal via a bond wire.

In some embodiments, the power semiconductor die may be a MOSFET. In some such embodiments, the first terminal may be a first source/drain terminal, the first lead may be a first source/drain lead, the second terminal may be a gate terminal, and the second lead may be a gate lead. In other embodiments, the first terminal may be a gate terminal, the first lead may be a gate lead, the second terminal may be a first source/drain terminal, and the second lead may be a first source/drain lead. In some embodiments, the second terminal (be it a gate terminal or a first source/drain terminal) may be bonded to the second lead via a second transient liquid phase solder joint. In some embodiments, the MOSFET further includes a second source/drain terminal that is bonded to the first metal cladding layer via a third transient liquid phase solder joint.

In some embodiments, the packaged electronic device further comprises a second source/drain lead that is electrically connected to the first metal cladding layer via a fourth transient liquid phase solder joint.

In some embodiments, the first terminal may be a first multilayer terminal that comprises at least a first metal layer and a second metal layer positioned outwardly of the first metal layer, where the second metal layer includes copper and/or nickel. In some embodiments, the first multilayer terminal may further include a third metal layer that includes tin positioned outwardly of the second metal layer.

In some embodiments, the second terminal may be a second multilayer terminal that comprises at least a first metal layer and a second metal layer positioned outwardly of the first metal layer, the second metal layer including copper and/or nickel. In some embodiments, the second multilayer terminal may further include a third metal layer that includes tin positioned outwardly of the second metal layer.

In some embodiments, the power semiconductor die may include a semiconductor layer structure that includes silicon carbide.

In some embodiments, the first metal cladding layer may be a first copper cladding layer, and the power substrate may further comprise a second copper cladding layer on a second surface of the dielectric substrate. In some embodiments, the power substrate further comprises a first metal braze layer between the dielectric substrate and the first copper cladding layer and a second metal braze layer between the dielectric substrate and the second copper cladding layer. In some embodiments, the dielectric substrate may be a ceramic substrate.

In some embodiments, the package further may further comprise an overmold encapsulation that is on at least three sides of the power semiconductor die and on at least a portion of the power substrate, and a first end of the first lead may extend outside the overmold encapsulation and a first end of the second lead may also extend outside the overmold encapsulation.

In some embodiments, the packaged electronic device may be a discrete packaged electronic device that includes a single power semiconductor die. In other embodiments, the packaged electronic device may be a power semiconductor module that includes at least two power semiconductor die.

Pursuant to further embodiments of the present invention, methods of packaging a power semiconductor die that comprises a first terminal and a second terminal are provided. Pursuant to these methods, a power substrate is provided that comprises a dielectric substrate having a first metal cladding layer on a first surface of the dielectric substrate. The power semiconductor die is attached to the first metal cladding layer. A first lead is attached to the first terminal via a first transient liquid phase solder joint. A second lead is electrically connected to the second terminal.

In some embodiments, the method may further comprise forming an encapsulation on at least three sides of the power semiconductor die and on at least a portion of the power substrate, where the first and second leads extend outside of the encapsulation.

In some embodiments, the first terminal may be a first multilayer terminal that comprises at least a first metal layer and a second metal layer positioned outwardly of the first metal layer, the second metal layer including copper and/or nickel. In such embodiments, attaching the first lead to the first terminal via the first transient liquid phase solder joint may comprise placing a first tin preform between the first multilayer terminal and the first lead and applying heat and/or pressure to bond the first lead to the first terminal via the first transient liquid phase solder joint.

In some embodiments, the second terminal may be a second multilayer terminal that comprises at least a third metal layer and a fourth metal layer positioned outwardly of the third metal layer, the fourth metal layer including copper and/or nickel, and the method may further comprise placing a second tin preform between the second multilayer terminal and the second lead and applying heat and/or pressure to bond the second lead to the second terminal via a second transient liquid phase solder joint.

In some embodiments, the power semiconductor die may be a MOSFET, the first multilayer terminal may be a first multilayer source/drain terminal and the MOSFET may further comprise a second multilayer source/drain terminal that comprises at least a fifth metal layer and a sixth metal layer positioned outwardly of the fifth metal layer, the sixth metal layer including copper and/or nickel. In such embodiments, attaching the power semiconductor die to the first metal cladding layer may comprise placing a third tin preform between the second multilayer source/drain terminal and the first metal cladding layer and applying heat and/or pressure to bond the second multilayer source/drain terminal to the first metal cladding layer via a third transient liquid phase solder joint.

In some embodiments, the first lead or the second lead may be a first source/drain lead, and the method may further comprise bonding a second source/drain lead to the first metal cladding layer via a fourth transient liquid phase solder joint. In such embodiments, the fourth transient liquid phase solder joint may be formed by placing a fourth tin preform between the second source/drain lead and the first metal cladding layer and applying heat and/or pressure to bond the second source/drain lead to the first metal cladding layer via a fourth transient liquid phase solder joint.

In some embodiments, the first terminal may be a first multilayer terminal that comprises at least a first metal layer, a second metal layer positioned outwardly of the first layer, the second metal layer including copper and/or nickel, and a third metal layer that includes tin positioned outwardly of the second metal layer. In such embodiments, attaching the first lead to the first terminal via the first transient liquid phase solder joint may comprise placing the first lead on the first multilayer terminal and applying heat and/or pressure to bond the first lead to the first terminal via the first transient liquid phase solder joint.

In some embodiments, the second terminal may be a second multilayer terminal that comprises at least a third metal layer, a fourth layer metal positioned outwardly of the third metal layer, the fourth metal layer including copper and/or nickel, and a fifth metal layer that includes tin positioned outwardly of the fourth metal layer. In such embodiments, the method may further comprise placing the second multilayer terminal on the second lead and applying heat and/or pressure to bond the second lead to the second terminal via a second transient liquid phase solder joint.

In some embodiments, the power semiconductor die may be a MOSFET, the first multilayer terminal may be a first multilayer source/drain terminal and the MOSFET may further comprise a second multilayer source/drain terminal that comprises at least a sixth metal layer, a seventh metal layer positioned outwardly of the sixth metal layer, the seventh metal layer including copper and/or nickel, and an eighth metal layer that includes tin positioned outwardly of the seventh metal layer. In such embodiments, the method may further comprise placing the second multilayer source/drain terminal on the first copper cladding layer and applying heat and/or pressure to bond the second multilayer source/drain terminal to the first metal cladding layer via a third transient liquid phase solder joint.

In some embodiments, the first lead or the second lead may be a first source/drain lead, and the method may further include coating tin on a first portion of the first metal cladding layer, placing a second source/drain lead on the tin coating, and applying heat and/or pressure to bond the second source/drain lead to the first metal cladding layer via a fourth transient liquid phase solder joint.

In some embodiments, the first terminal may be a first multilayer terminal that comprises at least a first metal layer and a second metal layer positioned outwardly of the first metal layer, the second metal layer including copper and/or nickel, where the first lead comprises a copper and/or nickel lead having a tin coating on a portion thereof. In such embodiments, attaching the first lead to the first terminal via the first transient liquid phase solder joint may comprise placing the portion of the first lead that includes the tin coating on the first multilayer terminal and applying heat and/or pressure to bond the first lead to the first terminal via the first transient liquid phase solder joint.

In some embodiments, the second terminal may be a second multilayer terminal that comprises at least a third metal layer and a fourth metal layer positioned outwardly of the third metal layer, the fourth metal layer including copper and/or nickel, and the second lead may be a copper and/or nickel lead having a tin coating on a portion thereof. In such embodiments, attaching the second lead to the second terminal via the second transient liquid phase solder joint may comprise placing the portion of the second lead that includes the tin coating on the second multilayer terminal and applying heat and/or pressure to bond the second lead to the second terminal via the second transient liquid phase solder joint.

In some embodiments, the power semiconductor die may be MOSFET, the first multilayer terminal may be a first multilayer source/drain terminal and the MOSFET may further include a second multilayer source/drain terminal that comprises at least a fifth metal layer and a sixth metal layer positioned outwardly of the sixth metal layer, the sixth metal layer including copper and/or nickel. In such embodiments, the method may further comprise coating tin on a first portion of the first metal cladding layer and applying heat and/or pressure to bond the second multilayer source/drain terminal to the first metal cladding layer via a third transient liquid phase solder joint.

In some embodiments, the first lead or the second lead may be a first source/drain lead, and the method may further comprise coating tin on a second portion of the first metal cladding layer, placing a second source/drain lead on the tin coating, and applying heat and/or pressure to bond the second source/drain lead to the first metal cladding layer via a fourth transient liquid phase solder joint.

In some embodiments, the power semiconductor die may be a semiconductor layer structure that includes silicon carbide. In some embodiments, the power semiconductor die may be a MOSFET, the first terminal may be a source terminal, the first lead may be a source lead, the second terminal may be a gate terminal, and the second lead may be a gate lead. In other embodiments, the power semiconductor die may be a MOSFET, the first terminal may be a gate terminal, the first lead may be a gate lead, the second terminal may be a drain terminal, and the second lead may be a drain lead. In some embodiments, the power substrate may be a ceramic substrate. In some embodiments, the encapsulation may be an overmold encapsulation.

Pursuant to still further embodiments of the present invention, methods of packaging a power semiconductor die that comprises a first terminal and a second terminal are provided in which a first tin preform is positioned between a first copper lead and the first terminal. Heat and/or pressure is applied to melt the first tin preform to form a first solder joint between the first copper lead and the first terminal.

In some embodiments, a power substrate that includes a dielectric substrate having a first metal cladding layer on a first surface of the dielectric substrate is provided, and the power semiconductor die is attached to the first metal cladding layer.

In some embodiments, the first solder joint may be a first transient liquid phase solder joint.

In some embodiments, the method may further comprise positioning a second tin preform between a second copper lead and the second terminal and applying heat and/or pressure to melt the second tin preform to form a second transient liquid phase solder joint between the second copper lead and the second terminal.

In some embodiments, the method may further comprise forming an overmold encapsulation on at least three sides of the power semiconductor die and on at least a portion of the power substrate. In such embodiments, the first and second leads may extend outside of the overmold encapsulation.

In some embodiments, the first terminal and the second terminal may each comprise copper and/or nickel.

In some embodiments, in the power semiconductor die may be a MOSFET the first terminal may be a first source/drain terminal, the second terminal may be a gate terminal, and the MOSFET may further include a second source/drain terminal that comprises copper. Additionally, the first metal cladding layer may be a copper cladding layer. In such embodiments, a third tin preform may be positioned between the second source/drain terminal and the first copper cladding layer and heat and/or pressure may be applied to melt the third tin preform to form a third transient liquid phase solder joint between the second source/drain terminal and the first copper cladding layer.

In some embodiments, the first lead may be a first source/drain lead and the second lead may be a gate lead, and the method may further comprise bonding a second source/drain lead to the first copper cladding layer via a fourth transient liquid phase solder joint. In such embodiments, the fourth transient liquid phase solder joint may be formed by placing a fourth tin preform between the second source/drain lead and the first copper cladding layer and applying heat and/or pressure to melt the fourth tin preform to form a fourth transient liquid phase solder joint between the second source/drain lead and the first copper cladding layer.

Figure 1:
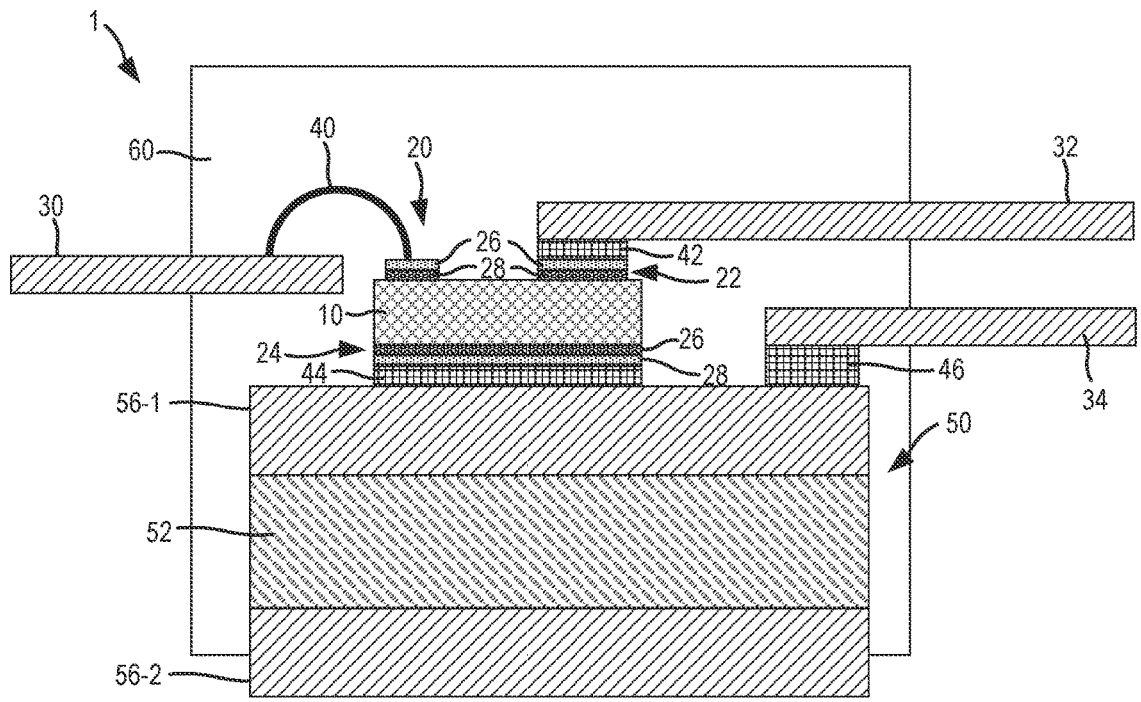
FIG. 1 is a schematic cross-sectional view of a conventional packaged electronic device.

Note that when multiple like elements are shown in the figures they may be identified using two-part reference numerals. Such elements may be referred to herein individually by their full reference numeral (e.g., the first metal cladding layer 56-1) and may be referred to collectively by the first part of their reference numeral (e.g., the metal cladding layers 56).

DETAILED DESCRIPTION

Packaged electronic devices that include one or more power semiconductor die typically generate large amounts of heat during device operation due to the large voltages applied to these devices and/or the large currents that flow through the semiconductor die and interconnections. In some cases, these temperatures may approach or even exceed the melting temperatures of conventional solders. For such applications, it is necessary to use sintering to bond leads to the power semiconductor die and to bond the power semiconductor die to an underlaying power substrate, since any reflowing of solder bonds may potentially damage the connections between the leads and the semiconductor die and/or the connection between the semiconductor die and the underlying power substrate. While sintered bonds provide improved high temperature performance as compared to conventional solder bonds, sintering typically uses materials such as silver that can migrate when exposed to high voltages, high temperature and/or moisture. The migrating silver can result in electrical short circuits that can damage or even destroy the power semiconductor die.

Pursuant to embodiments of the present invention, packaged electronic devices are provided that include at least one transient liquid phase solder joint that is used to connect a terminal of a power semiconductor die of the device to a corresponding lead and/or to a power substrate. A transient liquid phase solder joint refers to a solder joint that is formed at a first, relatively lower temperature (e.g., 260-300° C.) yet, once formed, will not melt until exposed to a second, relatively higher temperature (e.g., 400° C. or higher). In other words, a low-melting-point metal is used as solder to create a multi-metal bond that has a significantly higher melting point. In example embodiments, the transient liquid phase solder joint may be formed using tin as the solder to bond two copper or nickel elements together.

In some embodiments, transient liquid phase solder joints may be used to bond each of the terminals of the semiconductor die to corresponding leads or to the power substrate. For example, in a packaged electronic device that includes a power MOSFET die, a gate terminal of the MOSFET may be bonded to a gate lead of the package via a first transient liquid phase solder joint, a first source/drain terminal of the MOSFET may be bonded to a first source/drain lead of the package via a second transient liquid phase solder joint, and a second source/drain terminal of the MOSFET may be bonded to a first copper cladding layer of the power substrate via a third transient liquid phase solder joint. A fourth transient liquid phase solder joint may be used to bond a second source/drain lead of the package to the first copper cladding layer to electrically connect the second source/drain terminal to the second source/drain lead. In other embodiments, only some of the above discussed connections may be formed using transient liquid phase solder joints, and other of the connections may be, for example, sintered bonds or wire bonds.

The use of transient liquid phase solder joints may improve the reliability of the packaged electronic device and may also reduce manufacturing costs. In some embodiments, sheets of tin may be stamped to form tin solder preforms that may be used to form each of the transient liquid phase solder joints. The tin preforms may be positioned between copper (or nickel) terminals of the power semiconductor die and copper (or nickel) leads of cladding layers without the need for plating. In other embodiments, tin may be coated (e.g., plated) on the terminals of the power semiconductor die, on the leads, and/or on the first metal cladding layer of the power substrate.

In some embodiments, packaged electronic devices are provided that include a power semiconductor die that comprises a first terminal and a second terminal; a power substrate comprising a dielectric substrate having a first metal cladding layer on a first surface of the dielectric substrate; and a package that includes a first lead that is electrically connected to the first terminal and configured to connect to a first external circuit and a second lead that is electrically connected to the second terminal and configured to connect to a second external circuit. The first terminal is bonded to the first lead via a first transient liquid phase solder joint. In some embodiments, the second terminal may be bonded to the second lead via a second transient liquid phase solder joint. In other embodiments, the second lead may be electrically connected to the second terminal via a bond wire.

In other embodiments, methods of packaging a power semiconductor die are provided. The power semiconductor die includes at least a first terminal and a second terminal. Pursuant to these methods, a power substrate is provided that comprises a dielectric substrate having a first metal cladding layer on a first surface of the dielectric substrate. The power semiconductor die is attached to the first metal cladding layer. A first lead is attached to the first terminal via a first transient liquid phase solder joint. A second lead is electrically connected to the second terminal.

In still further embodiments of the present invention, methods of packaging a power semiconductor die that comprises a first terminal and a second terminal are provided in which a first tin preform is positioned between a first copper lead and the first terminal. Heat and/or pressure is applied to melt the first tin preform to form a first solder joint between the first copper lead and the first terminal.

Embodiments of the present invention will now be discussed in further detail with reference to the attached figures. It will be appreciated that features of the different embodiments disclosed herein may be combined in any way to provide many additional embodiments. Thus, it will be appreciated that various features of the present invention are described below with respect to specific examples, but that these features may be added to other embodiments and/or used in place of example features of other embodiments to provide many additional embodiments. Thus, the present invention should be understood to encompass these different combinations. Additionally, while the example embodiments focus on MOSFET implementations, it will be appreciated that the same techniques may be used in other packaged electronic devices such as insulated gate bipolar transistors (IGBTs), Schottky diodes, gate-controlled thyristors and the like.

Figure 2:
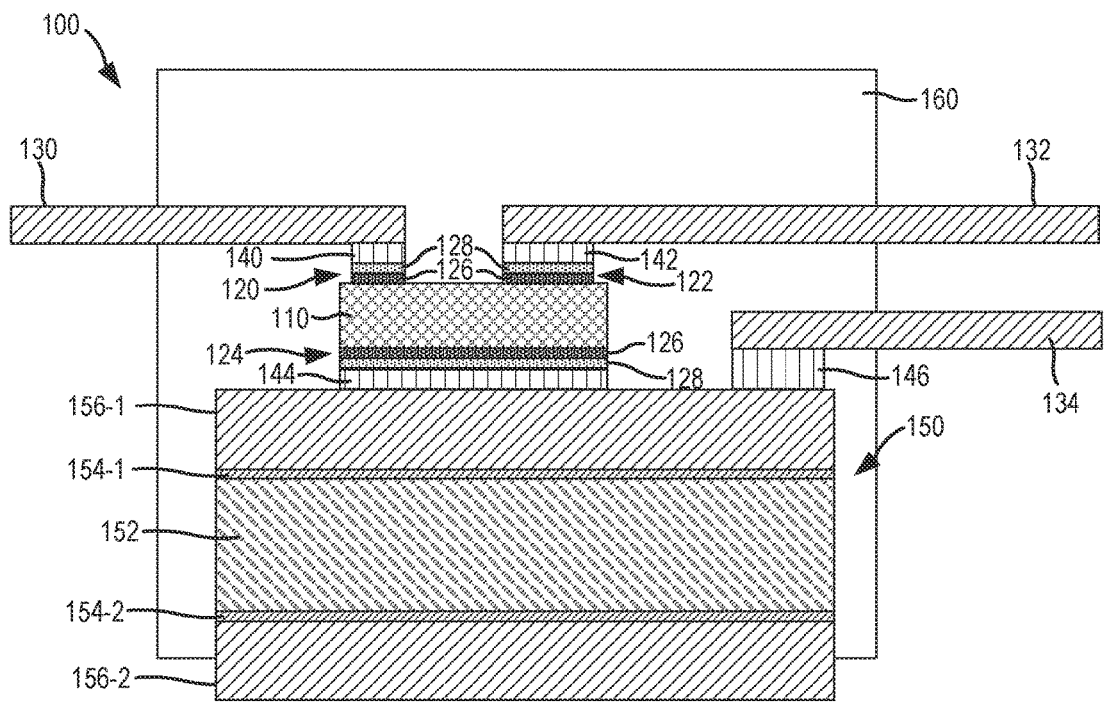
FIG. 2 is a schematic cross-sectional view of a packaged electronic device according to embodiments of the present invention.

FIG. 2 is a schematic cross-sectional view of a packaged electronic device 100 according to embodiments of the present invention. The packaged electronic device 100 may comprise, for example, a packaged power semiconductor module. Only one power semiconductor die is illustrated in FIG. 2 (and in the other figures) for simplicity. It will be appreciated, however, that the packaged electronic device 100 may include one or more additional power semiconductor die and/or additional circuitry.

As shown in FIG. 2, the packaged electronic device 100 includes a power semiconductor die 110 that is mounted on a power substrate 150. An encapsulation 160 covers the power semiconductor die 110 and at least a portion of the power substrate 150. A plurality of leads 130, 132, 134 extend through the encapsulation 160. The power substrate 150, leads 130, 132, 134 and the encapsulation 160 together form a package for the power semiconductor die 110 (and any other devices included in packaged electronic device 100).

The power semiconductor die 110 may be a semiconductor device that is designed to block high voltage levels (e.g., hundreds of volts or more) and/or to carry large currents. The power semiconductor die 110 may be formed using wide bandgap semiconductor materials such as silicon carbide and/or gallium nitride-based and/or aluminum nitride-based semiconductor systems (e.g., GaN, AlGaN, InGaN, AlN, etc.). Other wide bandgap materials may be used such as devices formed in other Group III-V semiconductor systems or in Group II-VI semiconductor systems. The power semiconductor die 110 may comprise, for example, a MOSFET, an IGBT, a Schottky diode, a gate-controlled thyristor, etc. The power semiconductor die 110 may have a vertical structure in which the upper side of the die includes at least one terminal and the lower side of the die also includes at least one terminal. For example, the device may comprise a vertical MOSFET that has a vertically extending drift region through which current flows during on-state operation.

The power semiconductor die 110 includes a plurality of terminals. For example, if the semiconductor die includes a vertical power MOSFET, the terminals may include a gate terminal 120, a first source/drain terminal 122 (e.g., a source terminal) and a second source/drain terminal 124 (e.g., a drain terminal). The gate terminal 120 and the first source/drain terminal 122 may be located on the upper side of the power semiconductor die 110 and the second source/drain terminal 124 may be located on the lower side of the power semiconductor die 110. In some embodiments, each terminal 120, 122, 124 may be implemented as a multilayer metal pad that includes at least one base metal 126 and at least one additional metal layer 128 positioned outwardly (i.e., farther away from a semiconductor layer structure of the power semiconductor die 110) of the base metal layer 126. The at least one additional metal layer 128 may comprise, for example, a copper and/or nickel plating 128 on an outer surface of the base metal 126. The terminals 120, 122, 124 comprise the locations where electrical signals that are transmitted to/from external sources are input/output from the power semiconductor die 110.

The power semiconductor die 110 is mounted on the power substrate 150. As used herein, the term "power substrate" refers to a structure that serves as a mounting base for one or more power semiconductor die, and potentially for other components as well. The power substrate 150 includes a dielectric substrate 152, which may comprise, for example, a ceramic substrate. In example embodiments, the dielectric substrate 152 may be formed of aluminum oxide (alumina), aluminum nitride, or silicon nitride. A thickness of the dielectric substrate 152 may be selected based on the voltage blocking capability of the packaged electronic device 100 (to ensure sufficient electrical isolation) and material cost considerations. For example, assuming that the dielectric substrate 152 is formed of alumina, the thickness may be in the range of 0.2 mm for a packaged electronic device 100 with a blocking voltage rating of 800 volts, while the thickness may be in the range of 0.5-1.0 mm for a packaged electronic device 100 with a blocking voltage rating of 10,000 volts.

One known power substrate is the so-called Active Metal Brazed ("AMB") power substrate. AMB power substrates include a dielectric (e.g., ceramic) substrate 152, first and second metal braze layers 154-1, 154-2, and first and second metal cladding layers 156-1, 156-2. The first and second metal braze layers 154-1, 154-2 are used to bond the respective first and second metal cladding layers 156-1, 156-2 to the ceramic substrate 152. Soldering cannot be used to bond metals to dielectric surfaces, but brazing can. The metal braze material has some similarities to solder, but the bonding process is performed at higher temperatures and most typically in a vacuum. The resulting bond is high in reliability as compared to conventional solder attachment. Another known type of power substrate is the Direct Bonded Substrate (which is often called a Direct Bonded Copper or "DBC" power substrate, as the metal cladding layers 156-1, 156-2 are typically copper layers). DBC power substrates are formed by pressing the metal cladding layers 156-1, 156-2 directly against the dielectric substrate 152 while being heat treated in a controlled atmosphere. DBC power substrates are not as reliable as AMB power substrates. It will be appreciated that power substrates other than AMB or DBC power substrates may also be used (e.g., a lead frame could be used as the power substrate).

In the embodiment shown in FIG. 2, the power substrate 150 is implemented as an AMB power substrate. Accordingly, a first metal braze layer 154-1 is formed on a first (upper) side of the dielectric substrate 152, and is used to bond a first metal cladding layer 156-1 to a first (upper) surface of the dielectric substrate 152. Similarly, a second metal braze layer 154-2 is formed on a second (lower) side of the dielectric substrate 152, and is used to bond a second metal cladding layer 156-2 to a second (lower) surface of dielectric substrate 152. The first and second metal braze layers 154-1, 154-2 may comprise, for example, metal alloys that include two or more metals such as copper, silver, nickel, gold, etc. The first and second metal braze layers 154-1, 154-2 may be thin layers (e.g., they may have thicknesses between 1-10 microns). The first and second metal cladding layers 156-1, 156-2 may comprise plated metal layers that include metals such as copper, nickel or aluminum (or other appropriate metals). The first and second metal cladding layers 156-1, 156-2 may be thicker or thinner than the dielectric substrate 152, since the thickness of the dielectric substrate 152 will typically vary based on the voltage rating of the device (since the higher the voltage rating, the thicker the dielectric substrate 152 needs to be to achieve a given level of electrical isolation). Each metal cladding layer 156 may be bonded to the ceramic substrate 152 by depositing the respective metal braze layer 154 on the ceramic substrate 152 and then depositing the metal cladding layer 156 on the metal braze layer 154 and curing the power substrate 150 at an elevated temperature of, for example, 500-1000° C. for a suitable period of time. The thicknesses of the first (upper) metal cladding layer 156-1 may vary based on the current rating of the device. The second (lower) metal cladding layer 156-1 facilitates bonding the power substrate 150 to, for example, a metal pad on a customer motherboard (not shown).

The power substrate 150 may serve as highly thermally conductive path that acts as the primary thermal interface for dissipating heat that is generated in the power semiconductor die 110 from the packaged electronic device 100. The dielectric substrate 152 electrically isolates the power semiconductor die 110 from a customer motherboard (not shown) or other device on which the packaged electronic device 100 may be mounted.

A gate lead 130 is attached to the gate terminal 120 of power semiconductor die 110 via a first transient liquid phase solder joint 140. As discussed above, a transient liquid phase solder joint refers to solder joint that is formed at a first, relatively lower temperature (often about 280° C.) yet, once formed, will not melt until exposed to a second, relatively higher temperature (typically well over 400° C.). A transient liquid phase solder joint may be formed to bond two copper layers together. In example embodiments, tin, or a tin containing material, is interposed between the two copper layers. The copper layers are pressed together and heated to a temperature of, for example, about 280° C. at a pressure of, for example, 1-5 MPa, which is sufficient to melt the tin. It will be appreciated that the temperature to which the copper layers and tin is heated and/or the pressure may be varied. In fact, in some cases it may be sufficient to only apply one of heat or pressure (although typically a combination of heat and pressure will be used). In response to the application of the heat and/or pressure, the liquid tin diffuses into the copper and form intermetallic phases. The sandwiched layers are held at the elevated "bonding" temperature until the liquid tin solidifies due to the diffusion process, and a different type of peritectic intermetallic compound is formed. Additional heating (either under pressure or not) may be performed to increase the size and/or number of peritectic phases. By this process, a metal bond (namely the transient liquid phase solder joint) is formed that comprises both copper and tin. Advantageously, the transient liquid phase solder joint has a melting temperature that is much higher than the melting temperature of the tin that is used to formed the joint. As a result, even if the power semiconductor die 110 reaches very high temperatures (e.g., 400° C.) during device operation, the transient liquid phase solder joint will not reflow. While copper/tin based transient liquid phase solder joints may be used in some embodiments, it will be appreciated that embodiments of the present invention are not limited thereto. For example, in other embodiments, nickel/tin or copper/nickel/tin transient liquid phase solder joints may be used.

Similar to the gate connection, a first source/drain lead 132 is attached to the first source/drain terminal 122 of power semiconductor die 110 via a second transient liquid phase solder bond 142. Additionally, a second source/drain terminal 124 of power semiconductor die 110 may be bonded to the first metal cladding layer 156-1 via a third transient liquid phase solder joint 144. A second source/drain lead 134 may likewise be bonded to the first metal cladding layer 156-1 via a fourth transient liquid phase solder joint 146. The second source/drain terminal 124 of power semiconductor die 110 may be electrically connected to the second source/drain lead 134 through the third and fourth transient liquid phase solder joints 144, 146 and the first metal cladding layer 156-1.

The gate lead 130, the first source/drain lead 132 and the second source/drain lead 134 may each comprise "floating" leads. Each floating lead may have a first end that is bonded to a respective terminal of the power semiconductor die 110 or to the power substrate 150 and a second end that extends outside the encapsulation 160. Each lead 130, 132, 134 may be connected to a respective external circuit element. The encapsulation 160 may support the leads 130, 132, 134 and hold them in place. The encapsulant 160 may comprise an overmold encapsulation that is formed to cover an upper side and side surfaces of the power semiconductor die 110 and at least a portion of the power substrate 150. It will be appreciated, however, that embodiments of the present invention are not limited thereto. For example, in other embodiments the encapsulant 160 may comprise a silicone gel or another compound.

FIGS. 3A-3E are schematic cross-sectional views illustrating a first method according to embodiments of the present invention of forming the packaged electronic device 100 of FIG. 2.

Figure 3A:
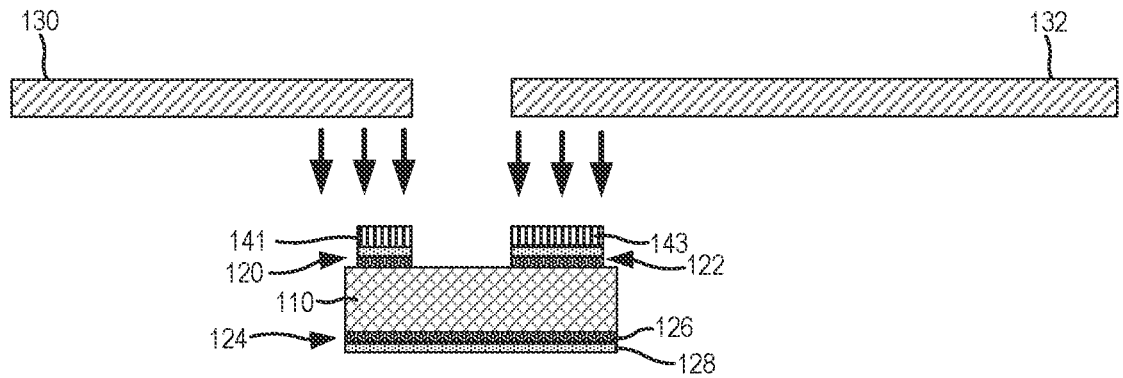
FIGS. 3A-3E are schematic cross-sectional views illustrating a first method according to embodiments of the present invention of forming the packaged electronic device of FIG. 2.

As shown in FIG. 3A, a power semiconductor die 110 is provided. In the illustrated embodiment, the power semiconductor die 110 is, for example, a MOSFET or IGBT that includes a gate terminal 120, a first source/drain terminal 122 (e.g., a source terminal) and a second source/drain terminal 124 (e.g., a drain terminal). As described above, each terminal 120, 122, 124 of the power semiconductor die 110 may comprise a multilayer metal pad that includes at least one base metal 126 and at least one additional metal layer 128 positioned outwardly of the base metal layer 126. The at least one additional metal layer 128 may comprise, for example, a copper and/or nickel plating 128 that is on an outer surface of the base metal 126. If a terminal has a copper or nickel base metal 126, the additional metal layer 128 may be omitted. A first tin preform 141 is placed on the additional metal layer 128 of the gate terminal 120, and a second tin preform 143 is placed on the additional metal layer 128 of the first source/drain terminal 122. The first and second tin preforms 141, 143 may comprise, for example planar pieces of tin that are stamped from a sheet of tin. The sheet material may comprise pure tin sheet material in some embodiments or a tin alloy in other embodiments.

Figure 3B:
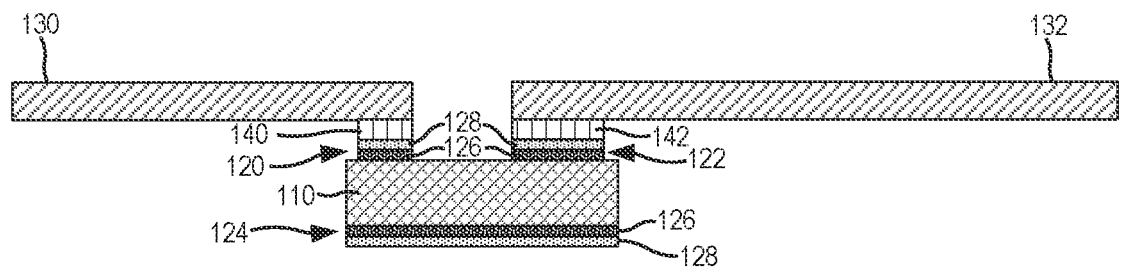

A gate lead 130 and a first source/drain lead 132 are also provided. The gate lead and the first source/drain lead 132 may comprise, for example, copper leads. The gate lead 130 is placed on the first tin preform 141 and the first source/drain lead 132 is placed on the second tin preform 143. The gate lead 130 and the first source/drain lead 132 are pressed against the power semiconductor die 110. Heat and/or pressure may then be applied to the elements shown in FIG. 3A in order to melt the first and second tin preforms 141, 143. The heat and/or pressure may be maintained and/or multiple heat/pressure steps may be performed in order to form a first transient liquid phase solder joint 140 between the gate lead 130 and the gate terminal 120 and to form a second transient liquid phase solder joint 142 between the first source/drain lead 132 and the first source/drain terminal 122, as shown in FIG. 3B. Each transient liquid phase solder joint may comprise a tin-copper joint. In some cases, the joint may comprise a copper-tin-copper joint in which the copper and tin are diffused throughout the solder joint, but more tin is present in the middle of the joint. The first and second tin preforms 141, 143 may alternatively be placed on the gate lead 130 and the first source/drain lead 132, and the gate terminal 120 and the first source/drain terminal 132 may be pressed against the gate lead and the first source/drain lead 130, 132.

Figure 3C:
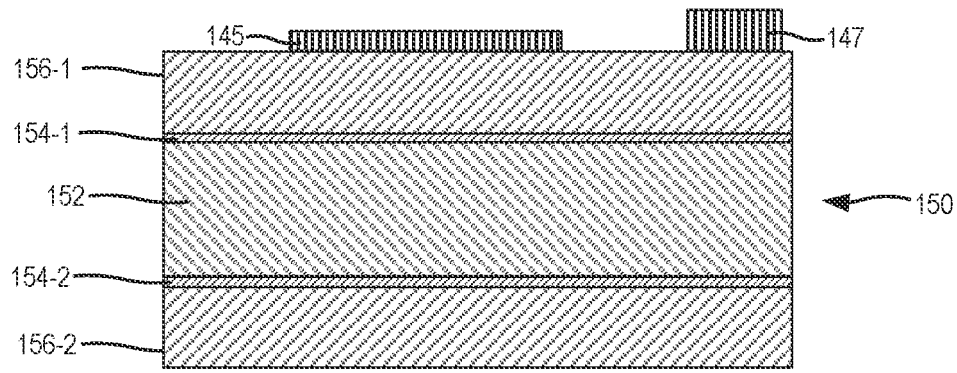

Referring to FIG. 3C, a power substrate 150 is also provided. In the example of FIGS. 3A-3E, the power substrate 150 is illustrated as an AMB power substrate, but it will be appreciated that other types of power substrates may be used. Third and fourth tin preforms 145, 147 are placed on an upper surface of the first (upper) metal cladding layer 156-1 of the power substrate 150. In example embodiments, the first (upper) metal cladding layer 156-1 may comprise a copper cladding layer. The third and fourth tin preforms 145, 147 may comprise, for example planar pieces of tin that are stamped from a sheet of tin.

Figure 3D:
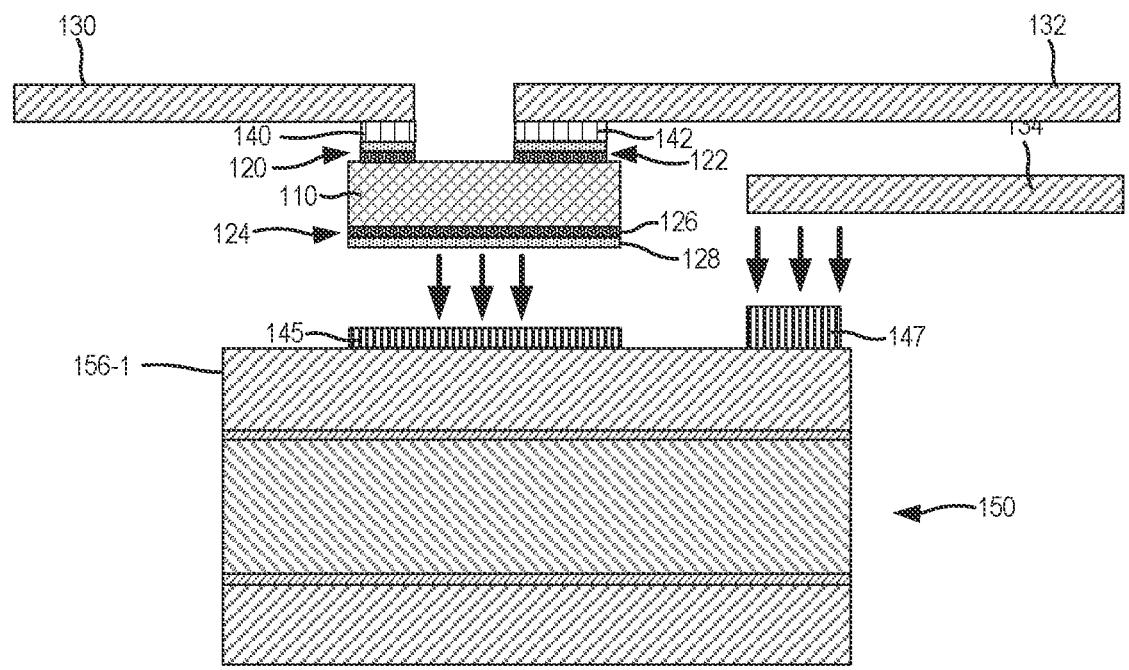
Figure 3E:
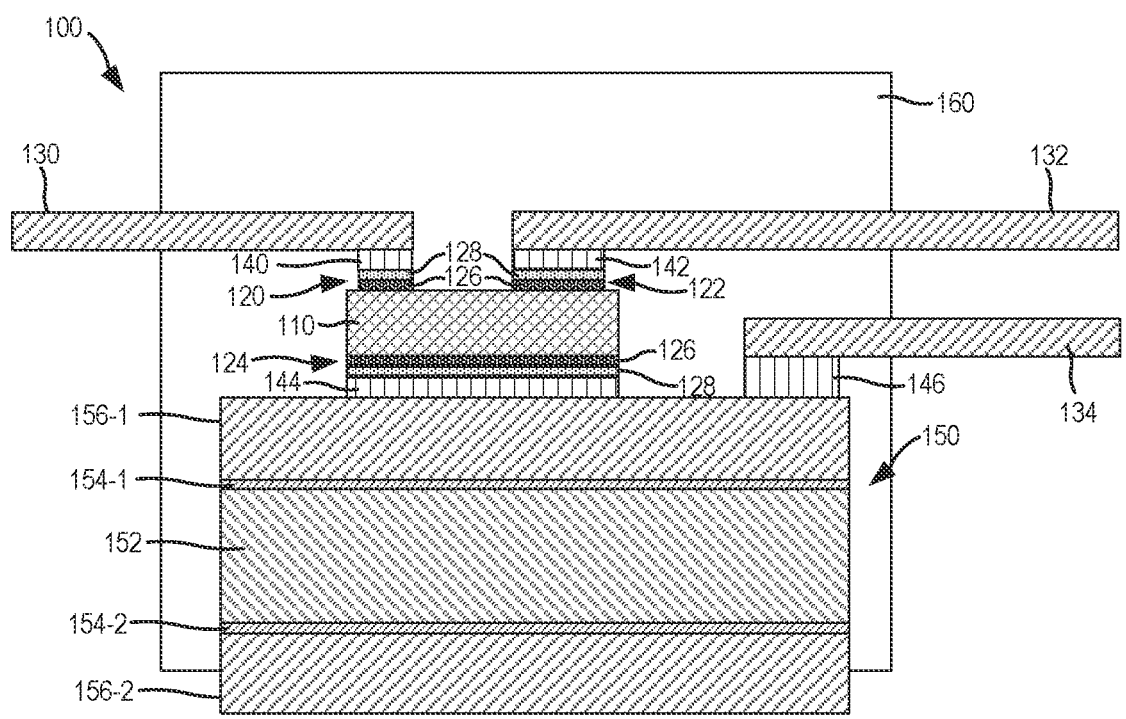

Referring to FIG. 3D, the power semiconductor die 110 (with the gate lead 130 and first source/drain lead 132 attached thereto) shown in FIG. 3B is placed on the third tin preform 145 that is on power substrate 150. Additionally, a second source/drain lead 134 is provided. The second source/drain lead 134 may comprise, for example, a copper lead. The second source/drain lead 134 is placed on the fourth tin preform 147. The power semiconductor die 110 and the second source/drain lead 134 are then pressed against the respective third and fourth tin preforms 145, 147 and the structure is heated (potentially under pressure, e.g., a pressure of 1-5 MPa) to melt the third and fourth tin preforms 145, 147, but the amount of heat and pressure is not sufficient to melt the first and second transient liquid phase solder joints 140, 142. The heat/pressure may be maintained and/or multiple heat/pressure steps may be performed in order to form a third transient liquid phase solder joint 144 between the second source/drain terminal 124 and the first metal cladding layer 156-1 of the power substrate 150 and to form a fourth transient liquid phase solder joint 146 between the second source/drain lead 134 and the first metal cladding layer 156-1 of the power substrate 150, as shown in FIG. 3E. Alternatively, the third and fourth tin preforms 145, 147 may be placed on source terminal 124 and the second source/drain lead 134 and the second source/drain terminal 124 may be pressed against the first metal cladding layer 156-1. As is further shown in FIG. 3E, an overmold encapsulation 160 may then be formed that covers the power semiconductor die 110 and at least a portion of the power substrate 150. The leads 130, 132, 134 extend through the encapsulation 160.

It will be appreciated that the steps of forming the packaged electronic device 100 described above may be performed in a different order, that multiple of the steps may be performed simultaneously, or that some steps may be broken out into multiple steps. For example, in other embodiments, the third and fourth transient liquid phase solder joints 144, 146 may be formed first to attach the power semiconductor die 110 and the second source/drain lead 134 to the power substrate 150, and the first and second transient liquid phase solder joints 140, 142 may then be formed thereafter in order to attach the gate lead 130 and the first source/drain lead 132 to the power semiconductor die 110. As additional examples, all four transient liquid phase solder joints 140, 142, 144, 146 may be formed simultaneously, or all four transient liquid phase solder joints 140, 142, 144, 146 may be formed individually. It will also be appreciated that the steps of forming the packaged electronic device 100 that are described below with reference to FIGS. 4A-4E and 5A-5E may also be performed in different orders, that multiple of the steps may be performed simultaneously, or that some steps may be broken out into multiple steps.

While tin preforms 141, 143, 145, 147 are illustrated in the example of FIGS. 3A-3E, it will be appreciated that other preforms may be used in other embodiments. For example, the tin preforms could be replaced with copper-tin preforms, tin-copper-tin preforms, or copper-tin-copper preforms in other embodiments. In some such embodiments, the additional metal layer 128 included in the gate terminal 130 and the first and second source/drain terminals 122, 124 may be omitted, as the copper in the copper-tin or copper-tin-copper preforms may eliminate any need for the additional metal layers 128. In some applications, it may be more cost effective to include the additional metal layers 128 in the gate terminal 120 and the first and second source/drain terminals 122, 124 so that low-cost tin preforms 141, 143, 145, 147 that are stamped from sheet material may be used.

FIGS. 4A-4E are schematic cross-sectional views illustrating a second method according to embodiments of the present invention of forming the packaged electronic device of FIG. 2.

Figure 4A:
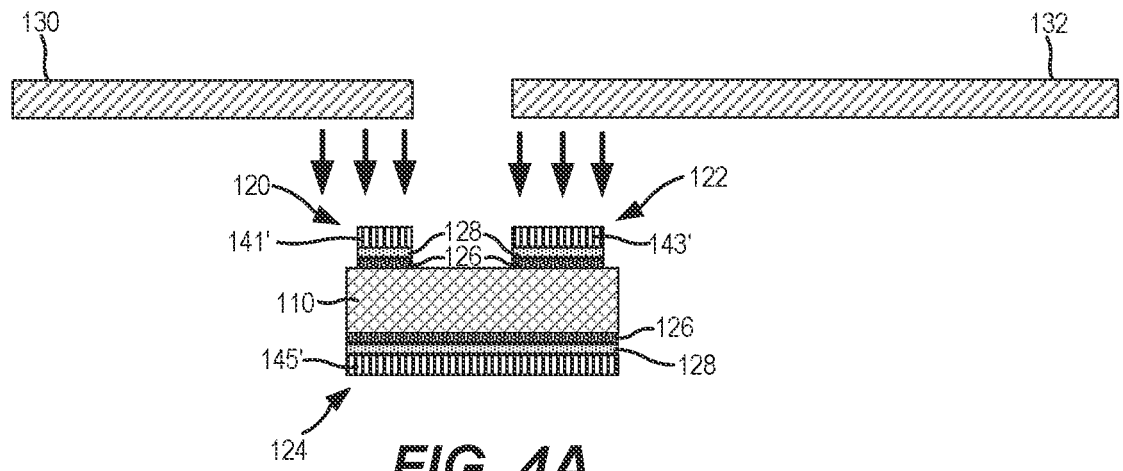
FIGS. 4A-4E are schematic cross-sectional views illustrating a second method according to embodiments of the present invention of forming the packaged electronic device of FIG. 2.

As shown in FIG. 4A, a power semiconductor die 110 (here shown as a MOSFET or IGBT) is provided that includes a gate terminal 120, a first source/drain terminal 122 and a second source/drain terminal 124. In some embodiments, each terminal 120, 122, 124 of the power semiconductor die 110 may comprise multilayer metal pad that includes at least one base metal 126, at least one additional metal layer 128 (e.g., a copper and/or nickel plating 128) positioned outwardly of the base metal layer 126, and a tin-containing layer 141', 143', 145' positioned outwardly of the additional metal layer 128. Each tin-containing layer 141', 143', 145' may comprise, for example, a tin coating that is plated or otherwise formed on an outer surface of the additional metal layer 128.

Figure 4B:
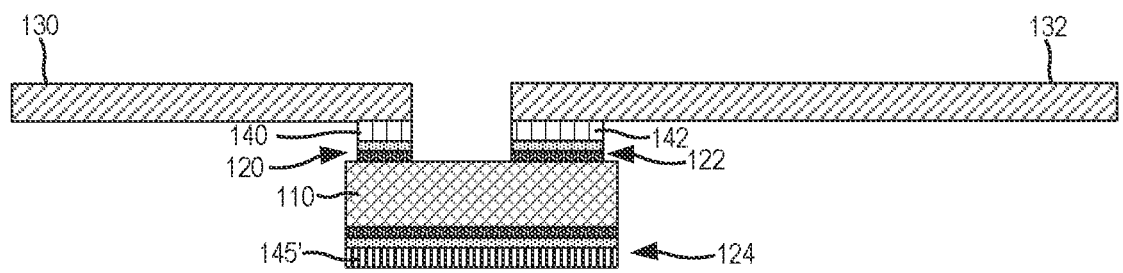

A gate lead 130 and a first source/drain lead 132 (e.g., a drain lead) are provided. The gate lead and the first source/drain lead 132 may comprise, for example, copper leads. The gate lead 130 is placed on the gate terminal 120 and the first source/drain lead 132 is placed on the first source/drain terminal 122. The gate lead 130 and the first source/drain lead 132 are pressed against the respective gate terminal 120 and first source/drain terminal 122, and the elements shown in FIG. 4A are then heated (potentially under pressure) to melt the tin in the tin-containing layers 141', 143'. The heat and/or pressure may be maintained and/or multiple heat/pressure steps may be performed in order to form a first transient liquid phase solder joint 140 between the gate lead 130 and the gate terminal 120 and to form a second transient liquid phase solder joint 142 between the first source/drain lead 132 and the first source/drain terminal 122, as shown in FIG. 4B.

Figure 4C:
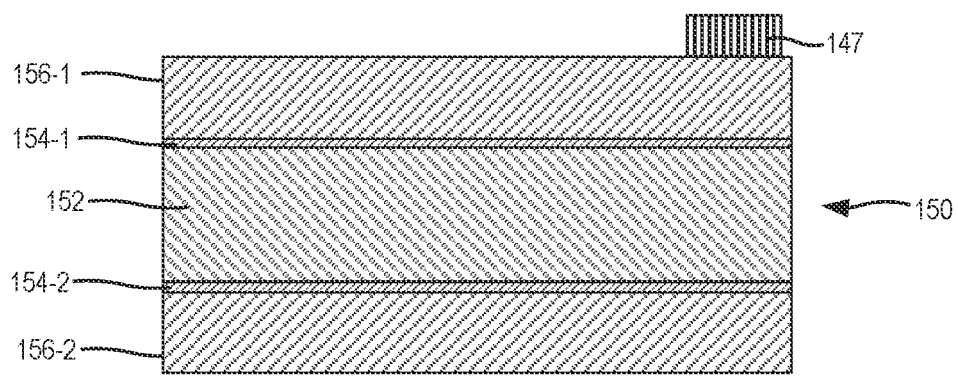

Referring to FIG. 4C, a power substrate 150 is also provided (which is shown as an AMB power substrate). A fourth tin preform 147 is placed on an upper surface of the first (upper) metal (e.g., copper) cladding layer 156-1 of the power substrate 150. The fourth tin preform 147 may comprise, for example a planar piece of tin that is stamped from a sheet of tin. Alternatively, a tin coating may be applied to the first metal cladding layer 156-1 or a tin preform or coating may be applied to a second source/drain lead 134 (see FIG. 4D).

Figure 4D:
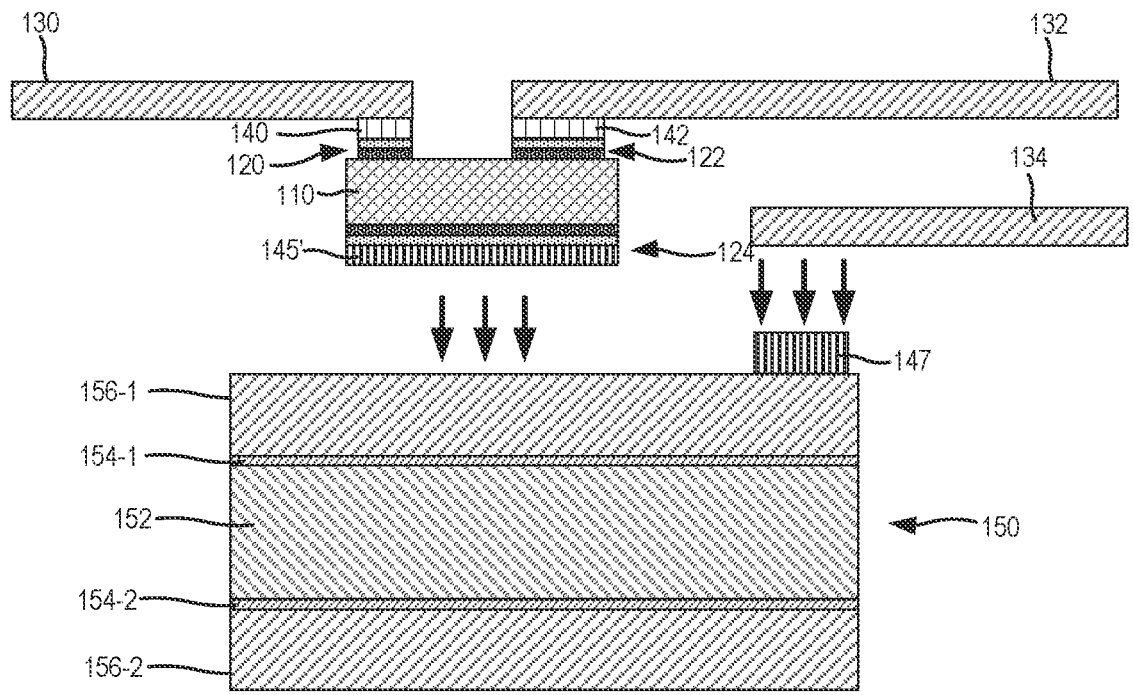
Figure 4E:
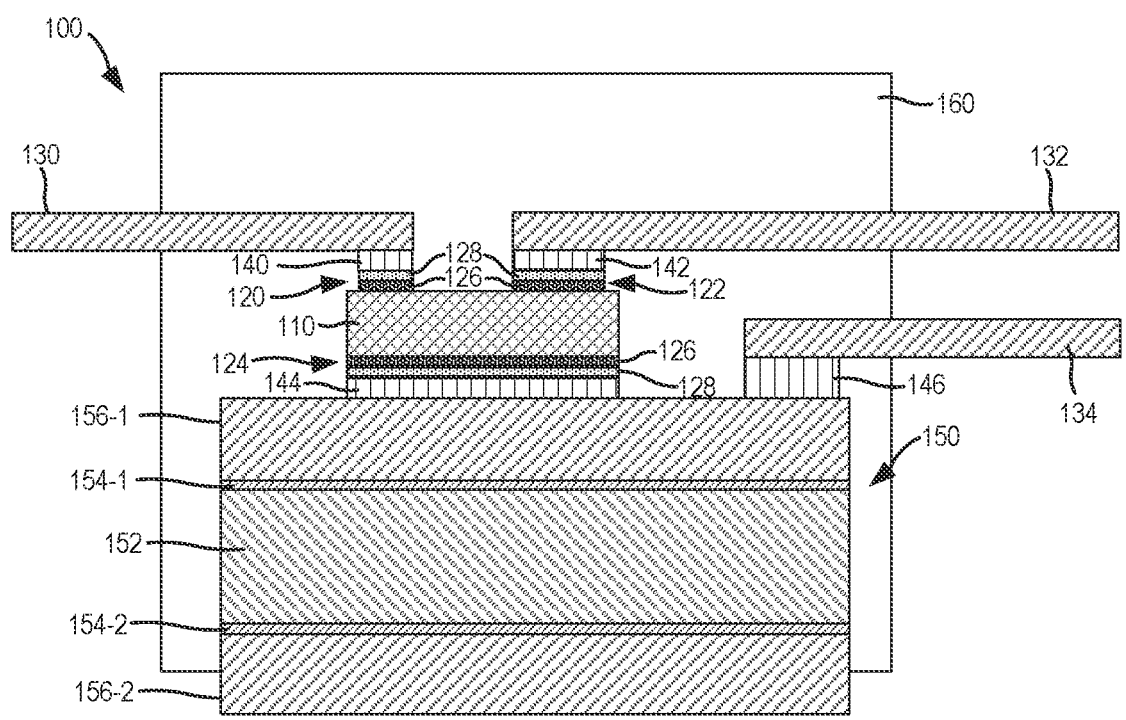

Referring to FIG. 4D, the power semiconductor die 110 (with the gate lead 130 and first source/drain lead 132 attached thereto) is placed on the power substrate 150, and the second source/drain lead 134 is placed on the fourth tin preform 147. The power semiconductor die 110 is pressed against the power substrate 150 and the second source/drain lead 134 is pressed against the fourth tin preform 147, and heat and/or pressure is applied to melt the tin in the tin-containing layer 145' and the fourth tin preform 147. The heat and/or pressure may be maintained and/or multiple heat/pressure steps may be performed in order to form a third transient liquid phase solder joint 144 between the second source/drain terminal 124 and the first metal cladding layer 156-1 of the power substrate 150 and to form a fourth transient liquid phase solder joint 146 between the second source/drain lead 134 and the first metal cladding layer 156-1 of the power substrate 150, as shown in FIG. 4E. As is further shown in FIG. 4E, an overmold encapsulation 160 may then be formed that covers the power semiconductor die 110 and at least a portion of the power substrate 150.

FIGS. 5A-5E are schematic cross-sectional views illustrating a third method according to embodiments of the present invention of forming the packaged electronic device of FIG. 2.

Figure 5A:
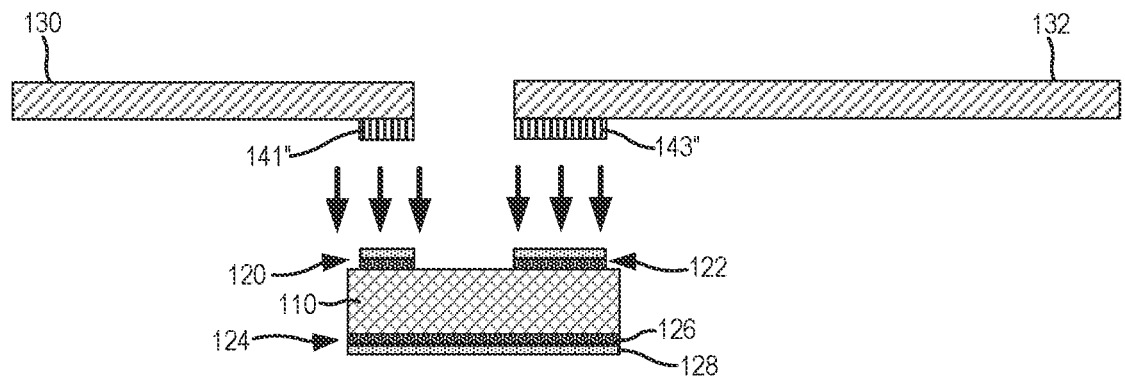
FIGS. 5A-5E are schematic cross-sectional views illustrating a third method according to embodiments of the present invention of forming the packaged electronic device of FIG. 2.

As shown in FIG. 5A, a power semiconductor die 110 (e.g. a MOSFET or IGBT) is provided that includes a gate terminal 120, a first source/drain terminal 122 and a second source/drain terminal 124. In some embodiments, each terminal 120, 122, 124 of the power semiconductor die 110 may comprise multilayer metal pad that includes at least one base metal 126 and at least one additional metal layer 128 (e.g., a copper and/or nickel plating 128) positioned outwardly of the base metal layer 126.

Figure 5B:
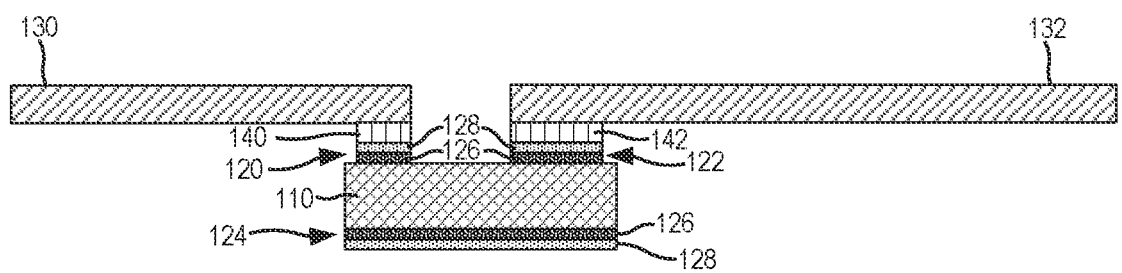

A gate lead 130 and a first source/drain lead 132 are provided, which may each be copper leads. A first tin coating 141" is applied (e.g., plated) to a first portion of the gate lead 130 and a second tin coating 143" is applied (e.g., plated) to a first portion of the first source/drain lead 132. The gate lead 130 is placed on the gate terminal 120 and the first source/drain lead 132 is placed on the first source/drain terminal 122, and the leads 130, 132 are pressed against the respective gate terminal 120 and first source/drain terminal 122. Heat and/or pressure is applied to the elements shown in FIG. 5A to melt the tin in the tin coatings 141", 143". The heat and/or pressure may be maintained and/or multiple heat/pressure steps may be performed in order to form a first transient liquid phase solder joint 140 between the gate lead 130 and the gate terminal 120 and to form a second transient liquid phase solder joint 142 between the first source/drain lead 132 and the first source/drain terminal 122, as shown in FIG. 5B.

Figure 5C:
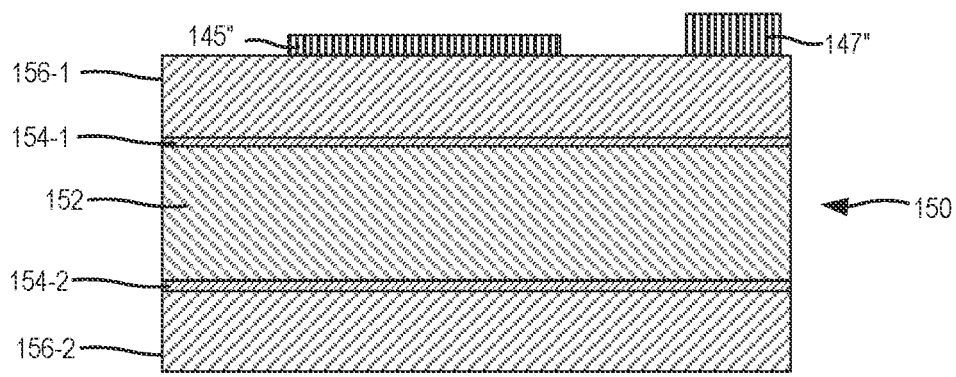

Referring to FIG. 5C, a power substrate 150 is also provided. Third and fourth tin coatings 145", 147" are formed (e.g., plated) on the upper surface of the first metal cladding layer 156-1 of the power substrate 150. Alternatively, third and fourth tin preforms 145, 147 may be placed on the first metal cladding layer 156-1.

Figure 5D:
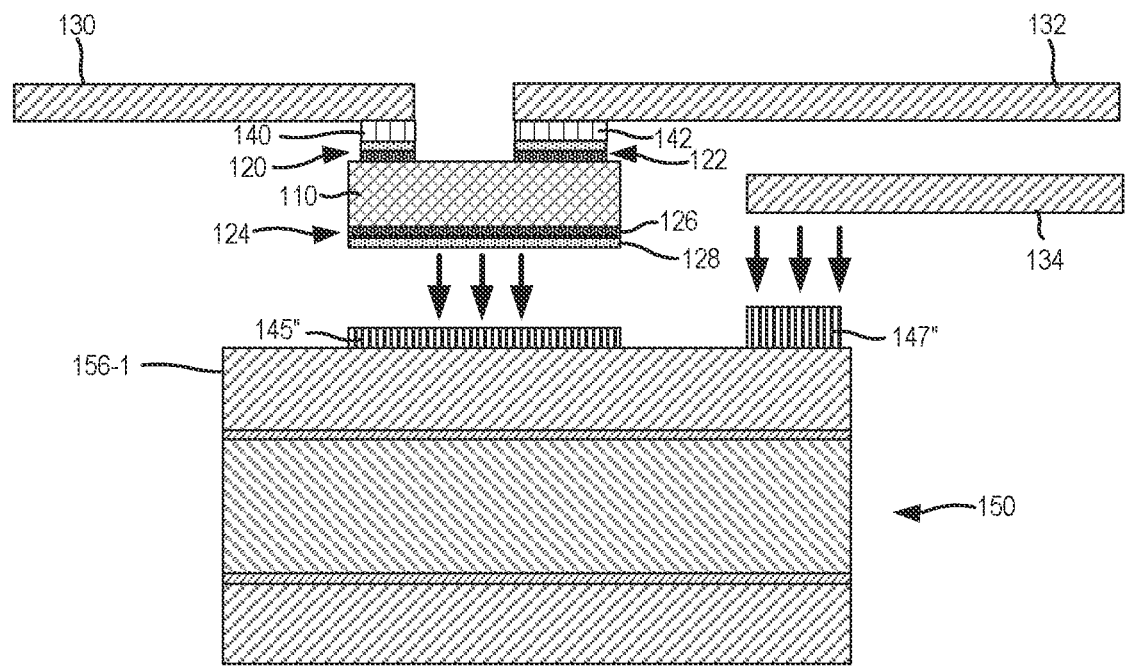
Figure 5E:
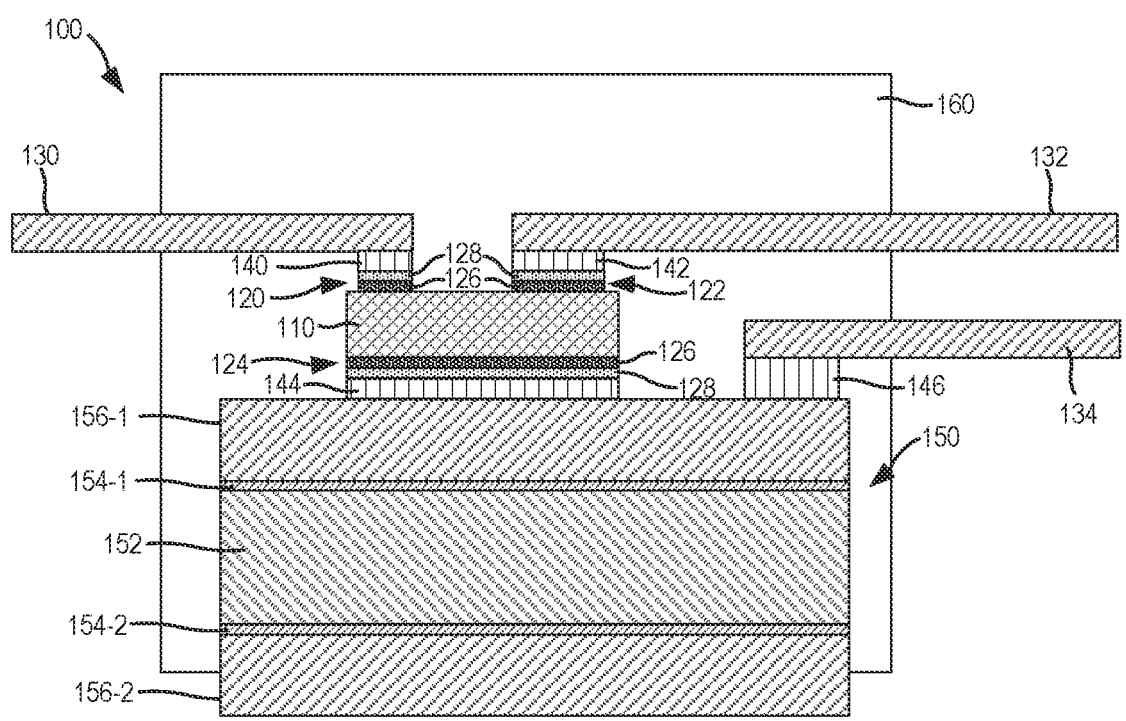

Referring to FIG. 5D, the power semiconductor die 110 (with the gate lead 130 and first source/drain lead 132 attached thereto) and the source lead are placed on the respective tin coatings 145", 147". The power semiconductor die 110 and the second source/drain lead 134 are pressed against the respective tin coatings 145", 147" on power substrate 150. Heat and/or pressure is applied to these elements in order to melt the tin coatings 145", 147", and the heat and/or pressure may be maintained and/or multiple heat/pressure steps may be performed in order to form a third transient liquid phase solder joint 144 between the second source/drain terminal 124 and the first metal cladding layer 156-1 of the power substrate 150 and to form a fourth transient liquid phase solder joint 146 between the second source/drain lead 134 and the first metal cladding layer 156-1 of the power substrate 150, as shown in FIG. 5E. As is further shown in FIG. 5E, an overmold encapsulation 160 may then be formed that covers the power semiconductor die 110 and at least a portion of the power substrate 150.

In some applications, the potential disadvantages associated with sintered connections may not arise for some of the bonds between the device leads and the power semiconductor die and power substrate. For example, in many cases, the bond between the second source/drain lead 134 and the power substrate 150 may be far enough away from the power semiconductor die 110 such that the potential for silver migration from the bond between the second source/drain lead 134 and the power substrate 150 to the power semiconductor die 110 to not be a concern. As another example, in some cases the potential for migration of silver between the leads 130, 132 on the upper surface of the power semiconductor die 110 may be a concern, but the potential for harmful silver migration from sintered bonds that are used to form the other joints may not be a concern. In such cases, sintered interconnections may be used for one or both of (1) the bond between the second source/drain terminal 124 and the power substrate 150 and (2) the bond between the second source/drain lead 134 and the power substrate 150.

Figure 6:
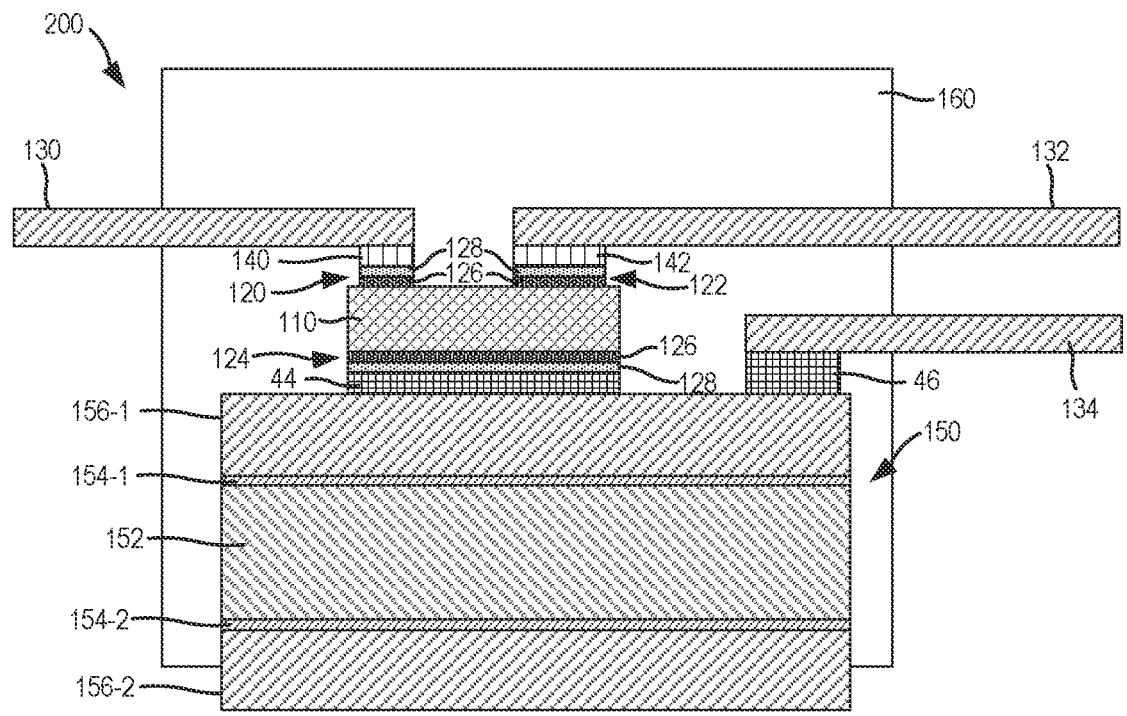
FIG. 6 is a schematic cross-sectional view of a packaged electronic device according to further embodiments of the present invention.
Figure 7:
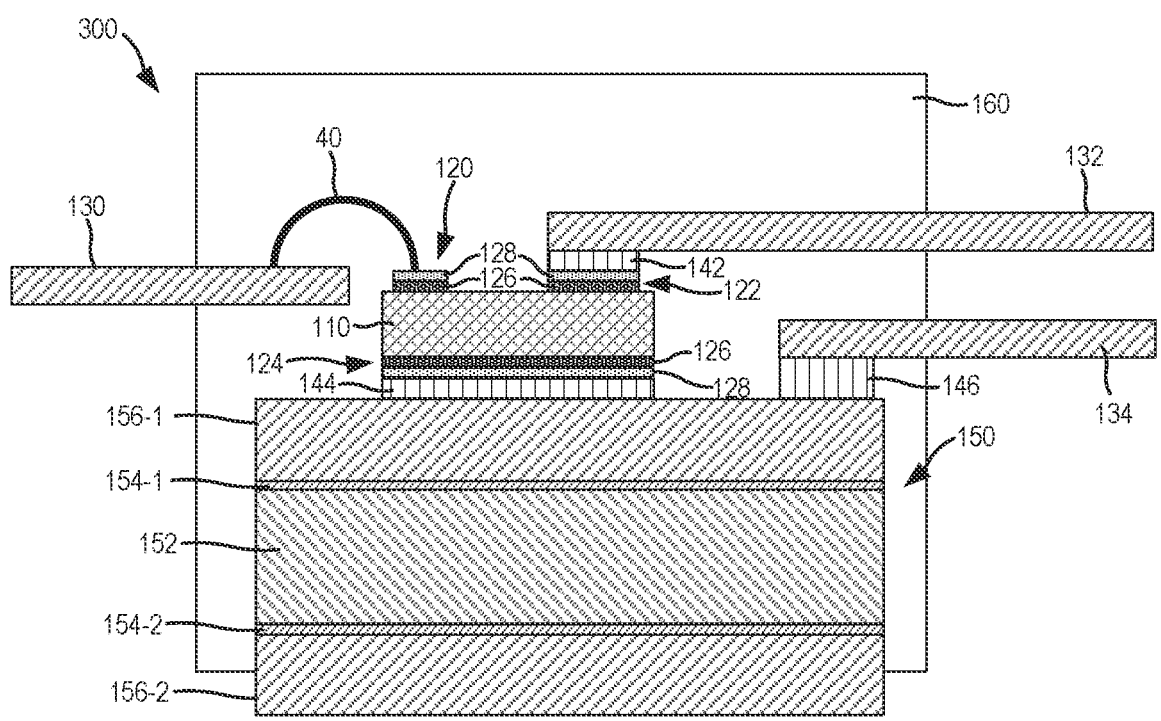
FIG. 7 is a schematic cross-sectional view of a packaged electronic device according to still further embodiments of the present invention.

FIGS. 6 and 7 illustrate packaged electronic devices according to further embodiments of the present invention. Elements of the packaged electronic devices shown in FIGS. 6 and 7 that are that are identical or substantially identical to corresponding elements of packaged electronic device 100 of FIG. 2 are therefore labelled using the same reference numerals as are used in FIG. 2, and further description of these like elements will generally be omitted.

FIG. 6 is a schematic cross-sectional view of a packaged electronic device 200 according to further embodiments of the present invention that includes both transient liquid phase solder joints and sintered bonds. As can be seen, the packaged electronic device 200 of FIG. 6 is almost identical to the packaged electronic device 100 of FIG. 2, except that the third and fourth transient liquid phase solder bonds 144, 146 included in packaged electronic device 100 are replaced in packaged electronic device 200 with sintered bonds 44, 46. In other embodiments, only one of the third and fourth transient liquid phase solder bonds 144, 146 may be replaced in packaged electronic device 200 with a sintered bond 44 or 46. Sintered bonds may have certain advantages over transient liquid phase solder joints (e.g., a sintered bond may be less brittle than a transient liquid phase solder joint and hence may be preferred in some applications for attaching the power semiconductor die 110 to the power substrate 150). Thus, the packaged electronic device 200 illustrates how the use of both transient liquid phase solder joints and sintered bonds may be employed in some embodiments to leverage the best of what both technologies have to offer. Any combination of the transient liquid phase solder joint bonds shown in FIG. 2 may be replaced with sintered bonds so long as the device includes at least one transient liquid phase solder joints.

It will also be appreciated that many modifications may be made to the packaged electronic devices according to embodiments of the present invention that are discussed above. For example, some of the bonds between the device leads and the power semiconductor die and power substrate may be formed using wire bonds as opposed to sintered or soldered connections. FIG. 7 is a schematic cross-sectional view of a packaged electronic device 300 according to further embodiments of the present invention. As can be seen the packaged electronic device 300 of FIG. 7 is almost identical to the packaged electronic device 100 of FIG. 2, except that the first transient liquid phase solder bond 140 included in packaged electronic device 100 is replaced in packaged electronic device 300 with a wire bond connection 40 similar to the one shown in FIG. 1. The connection between the first source/drain lead 132 and the first source/drain terminal 122 could alternatively or additionally be replaced with a wire bond connection, as could the connection between the second source/drain lead 134 and the first metal cladding layer 156-1 in other embodiments.

FIGS. 8A-8D are flow charts illustrating steps in methods of forming packaged electronic devices according to embodiments of the present invention.

Figure 8A:
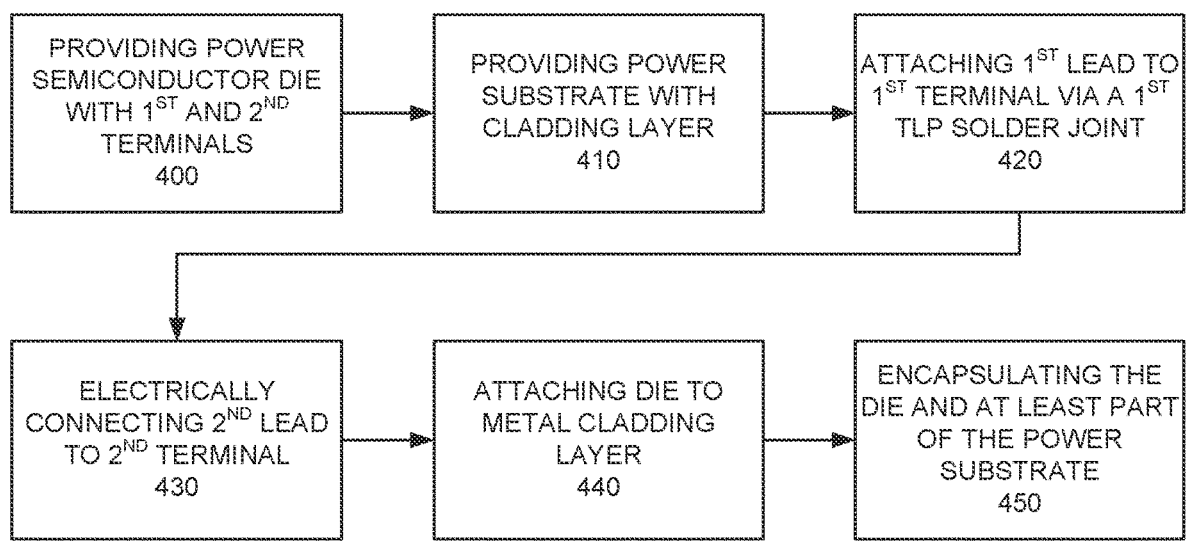
FIGS. 8A-8D are flow charts illustrating steps in methods of forming packaged electronic devices according to embodiments of the present invention.

As shown in FIG. 8A, in a first method, a power semiconductor die is provided that includes at least a first terminal and a second terminal (Block 400). A power substrate is also provided that includes a dielectric substrate having a first metal cladding layer on an upper surface thereof (Block 410). A first lead is attached to the first terminal of the power semiconductor die via a first transient liquid phase ("TLP") solder joint (Block 420). A second lead is electrically connected to the second terminal of the power semiconductor die (Block 430). In some example embodiments, the second lead is electrically connected to the second terminal of the power semiconductor die via a bond wire connection. In other example embodiments, the second lead is electrically connected to the second terminal of the power semiconductor die via a second TLP solder joint. The power semiconductor die is attached to the first metal cladding layer (Block 440). For example, the power semiconductor die may be attached to the first metal cladding layer via a third transient liquid phase solder joint or via a sintered connection. An encapsulation such as an overmold encapsulation is formed over the power semiconductor die and at least a portion of the power substrate, with the first and second leads extending out of the encapsulation (Block 450).

Figure 8B:
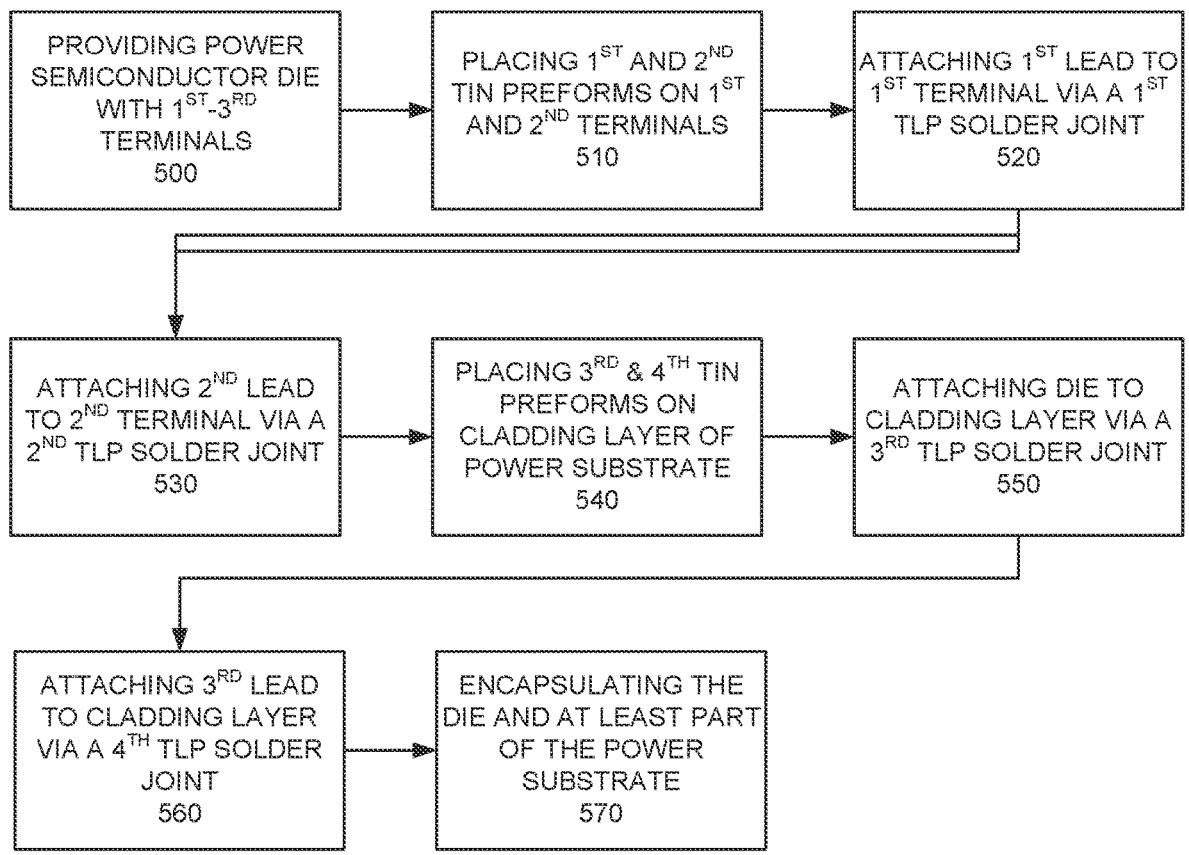

As shown in FIG. 8B, pursuant to a second method, a power semiconductor die is provided that includes at least first through third terminals (Block 500). First and second preforms such as tin containing preforms are placed on the first and second terminals (Block 510). A first lead is attached to the first terminal of the power semiconductor die via a first TLP solder joint that is formed using the metal of the first terminal, the metal of the first lead and the first preform (Block 520). A second lead is attached to the second terminal of the power semiconductor die via a second TLP solder joint that is formed using the metal of the second terminal, the metal of the second lead and the second preform (Block 530). Third and fourth preforms such as tin containing preforms are placed on a first metal cladding layer of a power substrate (Block 540). Alternatively, first and second portions of the first metal cladding layer may be coated with tin or a tin alloy. The third terminal of the power semiconductor die is placed on the third preform and heat and/or pressure is applied to attach the third terminal of the power semiconductor die to the first metal cladding layer of the power substrate via a third TLP solder joint. (Block 550). A third lead is placed on the fourth preform and heat and/or pressure is applied to attach the third lead to the first metal cladding layer of the power substrate via a fourth TLP solder joint. (Block 560). An encapsulation such as an overmold encapsulation may be formed over the power semiconductor die and at least a portion of the power substrate, with the first through third leads extending out of the encapsulation (Block 570).

Figure 8C:
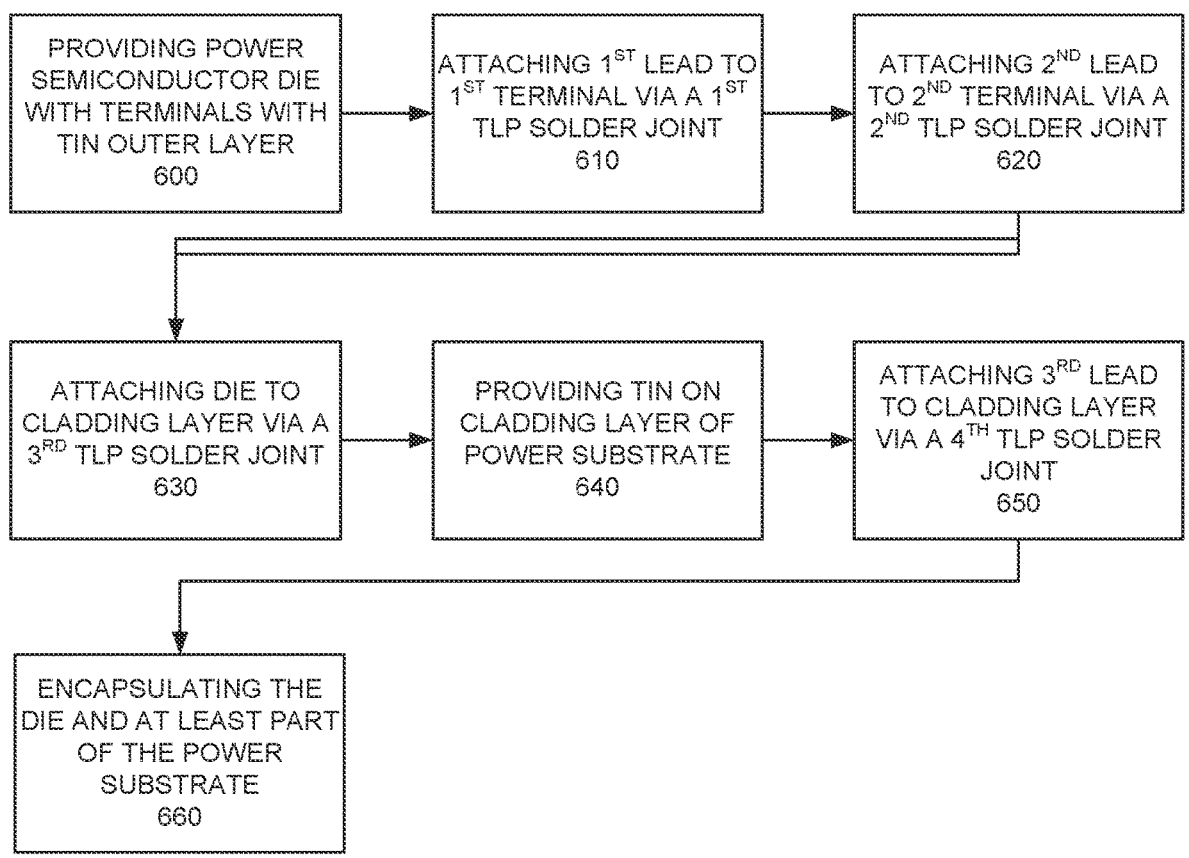

As shown in FIG. 8C, pursuant to a third method, a power semiconductor die is provided that includes at least first through third multilayer terminals, each of which have an outer metal layer that includes tin. (Block 600). A first lead is attached to the first terminal of the power semiconductor die via a first TLP solder joint that is formed using multiple of the metals of the first terminal and the metal of the first lead. (Block 610). A second lead is attached to the second terminal of the power semiconductor die via a second TLP solder joint that is formed using multiple of the metals of second terminal and the metal of the second lead (Block 620). The outer metal layer of the third terminal of the power semiconductor die is placed on a first metal cladding layer of a power substrate and heat and/or pressure is applied to attach the power semiconductor die to the first metal cladding layer of the power substrate via a third TLP solder joint. (Block 630). Tin is coated on another portion of the first metal cladding layer of the power substrate or a tin preform is placed on the first metal cladding layer (Block 640). A third lead is placed on the tin coating/preform and heat and/or pressure is applied to attach the third lead to the first metal cladding layer of the power substrate via a fourth TLP solder joint. (Block 650). An encapsulation such as an overmold encapsulation may be formed over the power semiconductor die and at least a portion of the power substrate, with the first through third leads extending out of the encapsulation (Block 660).

Figure 8D:
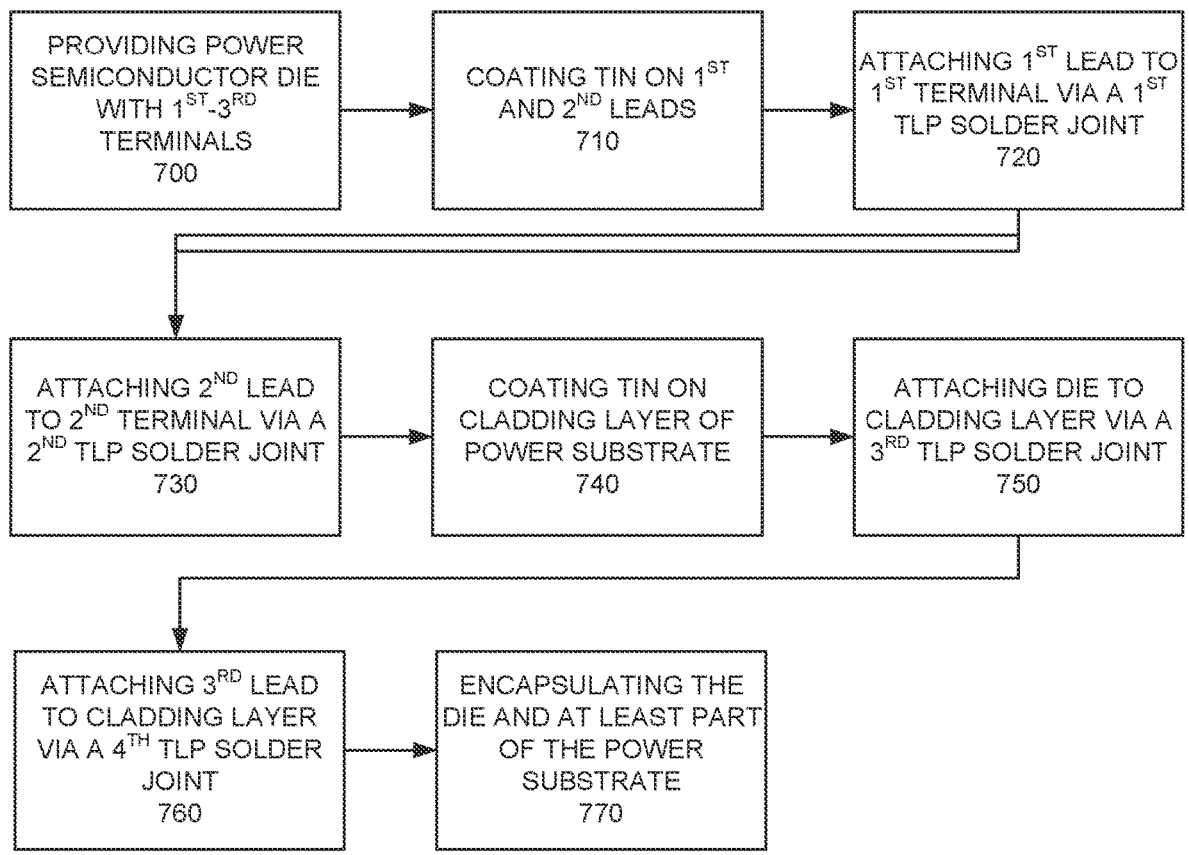

As shown in FIG. 8D, pursuant to a fourth method, a power semiconductor die is provided that includes at least first through third terminals. (Block 700). Tin is coated on respective portions of first and second leads (Block 710). The first lead is attached to the first terminal of the power semiconductor die via a first TLP solder joint that is formed using the tin coating on the first lead. (Block 720). The second lead is attached to the second terminal of the power semiconductor die via a second TLP solder joint that is formed using the tin coating on the second lead (Block 730). Tin is also coated on first and second portions of a first metal cladding layer of a power substrate (Block 740). The third terminal of the power semiconductor die is placed on the first tin-coated portion of the first metal cladding layer of the power substrate and heat and/or pressure is applied to attach the power semiconductor die to the first metal cladding layer via a third TLP solder joint. (Block 750). A third lead is placed on the second tin-coated portion of the first metal cladding layer and heat and/or pressure is applied to attach the third lead to the first metal cladding layer via a fourth TLP solder joint. (Block 760). An encapsulation such as an overmold encapsulation may be formed over the power semiconductor die and at least a portion of the power substrate, with the first through third leads extending out of the encapsulation (Block 770).

The packaged electronic devices according to embodiments of the present invention may also have several additional advantages as compared to conventional packaged electronic devices. For example, the terminals 30, 32, 34 of conventional packaged electronic device 1 each include a gold plating, which increases manufacturing costs. The gold plating is not required in the packaged electronic devices according to embodiments of the present invention. As another example, the solder joints included in the packaged electronic devices according to embodiments of the present invention may remain stable up to very high temperatures (e.g., temperatures of nearly 450° C. in example embodiments). As such, the devices according to embodiments of the present invention may operate at higher temperatures and still exhibit high reliability.

As noted above, the transient liquid phase solder joints may be formed using copper and tin in example embodiments, and using nickel and tin in other example embodiments. Combinations of nickel, copper and tin may also be used. For example, any of the transient liquid phase solder joints described above may be formed between a nickel layer and a copper layer by interposing a tin layer therebetween and applying heat and/or pressure while forcing the layers together. Similarly, one or both of the outer layers may comprise a copper-nickel alloy in other embodiments. It will also be appreciated that materials other than copper, nickel and tin may be used to form transient liquid solder bonds. For example, silver could be used to replace the copper or nickel in other embodiments. As another example, a tin-bismuth (Sn—Bi) layer could be used instead of tin in other embodiments.

The packaged electronic devices according to embodiments of the present invention may be particularly well-suited for automotive, industrial and other applications where the device will operate at high temperatures (e.g., temperatures above about 280° C.) where high device reliability is required. One example of such an application is automotive drive train inverter applications.

As discussed above, the packaged electronic devices according to embodiments of the present invention may be semiconductor power modules that include at least two power semiconductor die. It will be appreciated that when multiple power semiconductor die 110 are included in a packaged electronic device according to embodiments of the present invention, the semiconductor die 110 may the same or different, and may be electrically connected to each other and to the leads of the package in a variety of ways. Thus, in example embodiments, multiple power MOSFETs may be provided that are connected in series or parallel, multiple power Schottky diodes may be provided that are connected in series or parallel, one or more power MOSFETs and one or more power Schottky diodes may be connected in series or parallel, etc. It will also be appreciated that the techniques disclosed herein can be used in "discrete" packaged electronic devices that include a single power semiconductor die.

While embodiments of the present invention have been discussed above with reference to packaged electronic devices that include a power semiconductor die, it will be appreciated that embodiments of the present invention are not limited thereto. For example, all of the embodiments disclosed herein may include one or more radio frequency ("RF") semiconductor die in place of the power semiconductor die. For example, the semiconductor die included in the packaged electronic devices may comprise high electron mobility transistor ("HEMT") amplifiers that are designed to amplify RF signals.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "attached," "connected," or "coupled" to another element, it can be directly attached, directly connected or directly coupled to the other element or intervening elements may be present. In contrast, when an element is referred to as being "directly attached," "directly connected," or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected.

Herein, the term "plurality" means "at least two."

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A packaged electronic device, comprising:
   a power semiconductor die that comprises a first terminal and a second terminal;
   a power substrate comprising a dielectric substrate having a first metal cladding layer on a first surface of the dielectric substrate; and
   a package that includes:
      a first lead that is electrically connected to the first terminal;
      a second lead that is electrically connected to the second terminal; and
      an overmold encapsulation that is on at least an upper surface and side surfaces of the power substrate, wherein the first terminal is bonded to a first end of the first lead via a first transient liquid phase solder joint, and wherein the first lead extends through the overmold encapsulation so that a second end of the first lead is outside the overmold encapsulation.

2. The packaged electronic device of claim 1, wherein the power semiconductor die comprises a metal oxide semiconductor field effect transistor ("MOSFET").

3. The packaged electronic device of claim 2, wherein the first terminal comprises a first source/drain terminal, the first lead comprises a first source/drain lead, the second terminal comprises a gate terminal, and the second lead comprises a gate lead.

4. The packaged electronic device of claim 2, wherein the first terminal comprises a gate terminal, the first lead comprises a gate lead, the second terminal comprises a first source/drain terminal, and the second lead comprises a first source/drain lead.

5. The packaged electronic device of claim 2, wherein the second terminal is bonded to the second lead via a second transient liquid phase solder joint.

6. The packaged electronic device of claim 5, wherein the MOSFET further comprises a second source/drain terminal that is bonded to the first metal cladding layer via a third transient liquid phase solder joint.

7. The packaged electronic device of claim 6, further comprising a second source/drain lead that is electrically connected to the first metal cladding layer via a fourth transient liquid phase solder joint.

8. The packaged electronic device of claim 1, wherein the second terminal is bonded to the second lead via a second transient liquid phase solder joint.

9. The packaged electronic device of claim 3, wherein the MOSFET further includes a second source/drain terminal that is bonded to the first metal cladding layer via a third transient liquid phase solder joint.

10. The packaged electronic device of claim 3, further comprising a second source/drain lead that is electrically connected to the first metal cladding layer via a fourth transient liquid phase solder joint.

11. The packaged electronic device of claim 1, wherein the first terminal comprises a first multilayer terminal that comprises at least a first metal layer and a second metal layer positioned outwardly of the first metal layer, the second metal layer including copper and/or nickel.

12. The packaged electronic device of claim 11, wherein the first multilayer terminal further comprises a third metal layer that includes tin positioned outwardly of the second metal layer.

13. The packaged electronic device of claim 11, wherein the second terminal comprises a second multilayer terminal that comprises at least a first metal layer and a second metal layer positioned outwardly of the first metal layer, the second metal layer including copper and/or nickel.

14. The packaged electronic device of claim 13, wherein the second multilayer terminal further comprises a third metal layer that includes tin positioned outwardly of the second metal layer.

15. The packaged electronic device of claim 1, wherein the power semiconductor die comprises a semiconductor layer structure that includes silicon carbide.

16. The packaged electronic device of claim 1, wherein the first metal cladding layer comprises a first copper cladding layer, the power substrate further comprising a second copper cladding layer on a second surface of the dielectric substrate that is opposite the first surface.

17. The packaged electronic device of claim 16, wherein the power substrate further comprises a first metal braze layer between the dielectric substrate and the first copper cladding layer and a second metal braze layer between the dielectric substrate and the second copper cladding layer.

18. The packaged electronic device of claim 1, wherein the second lead is electrically connected to the second terminal via a bond wire.

19. A method of packaging a power semiconductor die that comprises a first terminal and a second terminal, the method comprising:

providing a power substrate comprising a dielectric substrate having a first metal cladding layer on a first surface of the dielectric substrate;

attaching the second terminal to the first metal cladding layer;

providing a tin-containing preform between a first lead and the first terminal;

attaching the first lead to the first terminal via a first transient liquid phase solder joint, wherein the first terminal comprises a copper or nickel layer that contacts the tin-containing preform.

20. The packaged electronic device of claim 1, wherein the first transient liquid phase solder joint comprises a first metal interposed between two outer metal layers, and wherein the first metal comprises tin.

21. The packaged electronic device of claim 20, wherein the two outer metal layers comprise copper and/or nickel.

22. The packaged electronic device of claim 20, wherein a melting point of the first transient liquid phase solder joint is greater than a melting point of the first metal.

23. The method of claim 1, wherein the first lead is held in place by the overmold encapsulation.

24. The method of claim 19, wherein the tin-containing preform comprises a stamped tin preform.

25. A packaged electronic device, comprising:

a power semiconductor die that comprises a first terminal, a second terminal and a third terminal;

a power substrate comprising a dielectric substrate having a metal cladding layer on a first surface of the dielectric substrate; and a package that includes:
  a first lead that is connected to the first terminal via a first transient liquid phase solder joint; and
  a second lead that is electrically connected to the second terminal via a second transient liquid phase solder joint;
  a third transient liquid phase solder joint that connects the third terminal to the metal cladding layer; and
  a third lead that is electrically connected to the metal cladding layer via a fourth transient liquid phase solder joint.

26. The packaged electronic device of claim 25, further comprising an overmold encapsulation, where the first lead, the second lead and the third lead extend through the overmold encapsulation.

27. The packaged electronic device of claim 26, where the first lead and the second lead are each floating leads.

* * * * *